(12) United States Patent
Kato et al.

(10) Patent No.: US 8,871,654 B2
(45) Date of Patent: Oct. 28, 2014

(54) FILM DEPOSITION APPARATUS, AND METHOD OF DEPOSITING A FILM

(71) Applicant: Tokyo Electron Limited, Tokyo (JP)

(72) Inventors: Hitoshi Kato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/934,548

(22) Filed: Jul. 3, 2013

(65) Prior Publication Data
US 2014/0011369 A1   Jan. 9, 2014

(30) Foreign Application Priority Data
Jul. 6, 2012   (JP) ................. 2012-152940

(51) Int. Cl.
*H01L 21/02* (2006.01)
*C23C 16/40* (2006.01)
*C23C 16/455* (2006.01)
*C23C 16/46* (2006.01)

(52) U.S. Cl.
CPC .... *H01L 21/02233* (2013.01); *H01L 21/02565* (2013.01); *C23C 16/402* (2013.01); *C23C 16/45538* (2013.01); *C23C 16/45551* (2013.01); *C23C 16/46* (2013.01); *H01L 21/02164* (2013.01); *H01L 21/02219* (2013.01); *H01L 21/02274* (2013.01); *H01L 21/0228* (2013.01)
USPC ............. 438/771; 438/787; 438/778

(58) Field of Classification Search
CPC ..................... H01L 29/7869; H01L 21/12
USPC .................................................. 438/771
See application file for complete search history.

(56) References Cited

U.S. PATENT DOCUMENTS

2014/0024200 A1 * 1/2014 Kato et al. ............... 438/473

FOREIGN PATENT DOCUMENTS

JP    2010-245448    10/2010

* cited by examiner

*Primary Examiner* — Zandra Smith
*Assistant Examiner* — Damian A Hillman
(74) *Attorney, Agent, or Firm* — IPUSA, PLLC

(57) ABSTRACT

A film deposition apparatus forming a thin film by after repeating cycles of sequentially supplying gases to a substrate on a turntable inside a vacuum chamber that includes a first supplying portion for causing the substrate to absorb a first gas containing silicon; a second supplying portion apart from the first supplying portion for supplying a second gas containing active species to produce a silicone dioxide; a separating area between the first and second supplying portions for preventing their mixture; a main heating mechanism for heating the substrate; and an auxiliary mechanism including a heat lamp above the turntable and having a wavelength range absorbable by the substrate to directly heat to be a processing temperature at which an ozone gas is thermally decomposed, wherein a maximum temperature is lower than the thermally decomposed temperature, at which, the first gas is absorbed and oxidized by the second gas.

7 Claims, 18 Drawing Sheets

FILM DEPOSITION APPARATUS, AND METHOD OF DEPOSITING A FILM

CROSS-REFERENCE TO RELATED APPLICATIONS

This patent application is based upon and claims the benefit of priority of Japanese Patent Application No. 2012-152940 filed on Jul. 6, 2012, the entire contents of which are incorporated herein by reference.

BACKGROUND OF THE INVENTION

1. Field of the Invention

The present invention relates to a technique of sequentially supplying process gases in a film deposition apparatus, which mutually react, by revolving substrates using a turntable to thereby laminate reaction products on a surface of the substrate and deposit a silicon dioxide.

2. Description of the Related Art

As one method of depositing a thin film such as a silicon dioxide film ($SiO_2$) on a semiconductor wafer (hereinafter, referred to as "wafer"), an Atomic Layer Deposition (ALD) method is known. According to this ALD method, a plurality types of process gases (reaction gases), which mutually react, are sequentially supplied on the surface of a wafer to thereby laminate reaction products. Japanese Laid-open Patent Publication No. 2010-245448 discloses a film deposition apparatus, with which a film is deposited by the ALD method. The film deposition apparatus is structured such that a turntable, on which a plurality of wafers are mounted so as to be arranged in a peripheral direction, is provided, and a plurality of gas nozzles is arranged so as to face the turntable. For example, the process gas is, for example, a gas containing silicon (Si) such as bis(tertiary-butylaminosilane) (BTBAS) gas and an oxidation gas such as an ozon ($O_3$) gas. A film deposition process is performed by revolving the turntable relative to the gas nozzle while heating the wafers using a heater provided on a lower side of the turntable. With this, the Si containing gas and the ozone gas are sequentially supplied to the wafer. Thus, a reaction is performed to oxidize the Si containing gas using the ozone gas. Then, a $SiO_2$ film is formed.

It is anticipated that high denseness is required depending on a portion of a semiconductor device, to which a $SiO_2$ is applied. In order to obtain such a $SiO_2$ film, it is necessary to perform the reaction at a high temperature exceeding, for example, 650° C. However, if a film deposition apparatus causing the wafers W to orbitally revolve with the turntable is used, a heat-resistant structure of the sealing portion for maintaining a vacuum atmosphere is not easily obtainable. Further, because the gas nozzle provided on an upper side of the turntable is heated by heat of the turntable, if the turntable exceeds 650° C., the temperature of the gas nozzle is increased. Therefore, the internal temperature of the gas nozzle exceeds the temperature of 550° C., at which the ozone gas is thermally decomposed. Therefore, before the ozone gas reaches the turntable, the ozone gas is thermally decomposed into oxygen. Therefore, oxidation power of the ozone gas is reduced, and such an ozone gas cannot be used as an oxidation gas. Therefore, if a film deposition apparatus, which has special specifications and is different from a type using an ozone gas, is to be manufactured, the manufacturing cost of such a film deposition apparatus becomes high.

Japanese Laid-open Patent Publication No. 2010-245448 discloses a structure in which a heater unit is provided on the lower side of the turntable, and a rod-like infrared lamp is additionally provided on the upper side of the turntable.

SUMMARY OF THE INVENTION

Accordingly, embodiments of the present invention may provide a new and useful film deposition apparatus and a method of depositing a film. More specifically, the embodiments of the present invention may provide a film deposition apparatus and a method of depositing a film, which enable to perform a film deposition process at a high temperature higher than a temperature of thermally decomposing an ozone gas, using an ozone gas as an oxidation gas in designing heat resistance of the film deposition apparatus when a silicon dioxide film is deposited by repeating absorption and oxidation of a process gas while orbitally revolving substrates on a turntable.

According to a first aspect of the present invention, there is provided a film deposition apparatus for forming a thin film by laminating layers of reaction product after repeating a plurality of cycles of sequentially supplying mutually different process gases to a substrate mounted on a turntable inside a vacuum chamber while orbitally revolving the substrate mounted on the turntable, including a first process gas supplying portion that supplies a first process gas containing silicon to the substrate to cause the substrate to absorb the first process gas; a second process gas supplying portion that is located apart in a rotational direction of the turntable from the first process gas supplying portion, the second process gas supplying portion supplying a second process gas containing active species obtained by activating oxygen to the substrate to oxidize the first process gas absorbed by the substrate in order to produce a silicone dioxide; a separating area that is located between the first gas supplying portion and the second gas supplying portion, the separating area preventing the first process gas and the second process gas from mixing; a main heating mechanism that heats the turntable to heat the substrate through the turntable from a lower side of the substrate; and an auxiliary heating mechanism that includes a heat lamp located above the turntable so as to face an area where the substrate on the turntable passes, the heat lamp irradiating light having an absorption wavelength range absorbable by the substrate to directly heat the substrate so that the substrate has a processing temperature equal to or higher than a temperature at which an ozone gas is thermally decomposed by radiation heat generated by the irradiated light, wherein a maximum temperature of the turntable allowed for performing functions of the film deposition apparatus is lower than the temperature at which the ozone gas is thermally decomposed, and at the processing temperature, the first process gas is absorbed by the substrate and the absorbed first process gas is oxidized by the second process gas.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

In the above related art, the wafer is heated to be, for example, 350° C. or higher by the heater unit, and a surface layer portion of the wafer is heated to be, for example, 350° C. or higher by a heat lamp to thereby remove impurities (organic substances) in a silicon dioxide film. According to the above related art, when phosphorus (P) is mixed into the silicon dioxide film, the wafer is heated to be 700° C. to 800° C. to thereby take phosphorus into the silicon dioxide film. However, if the turntable is heated to be 700° C. or higher, the ozone gas is thermally decomposed before the ozone gas is supplied to the wafer.

A description is given below, with reference to FIG. 1 through FIG. 14 of embodiments of the present invention.

In the embodiments described below, the reference symbols typically designate as follows.
W: wafer;
1: vacuum chamber;
2: turntable;
31: process gas nozzle;
32: activating gas injector;
42: separation gas nozzle;
5: heater unit;
7: lamp unit;
71: heat lamp;
73: reflector;
P1: first process area;
P2: second process area;
D1, D2: separating area; and
H: heating area.

First Embodiment
<Film Deposition Apparatus>

Figure 1:
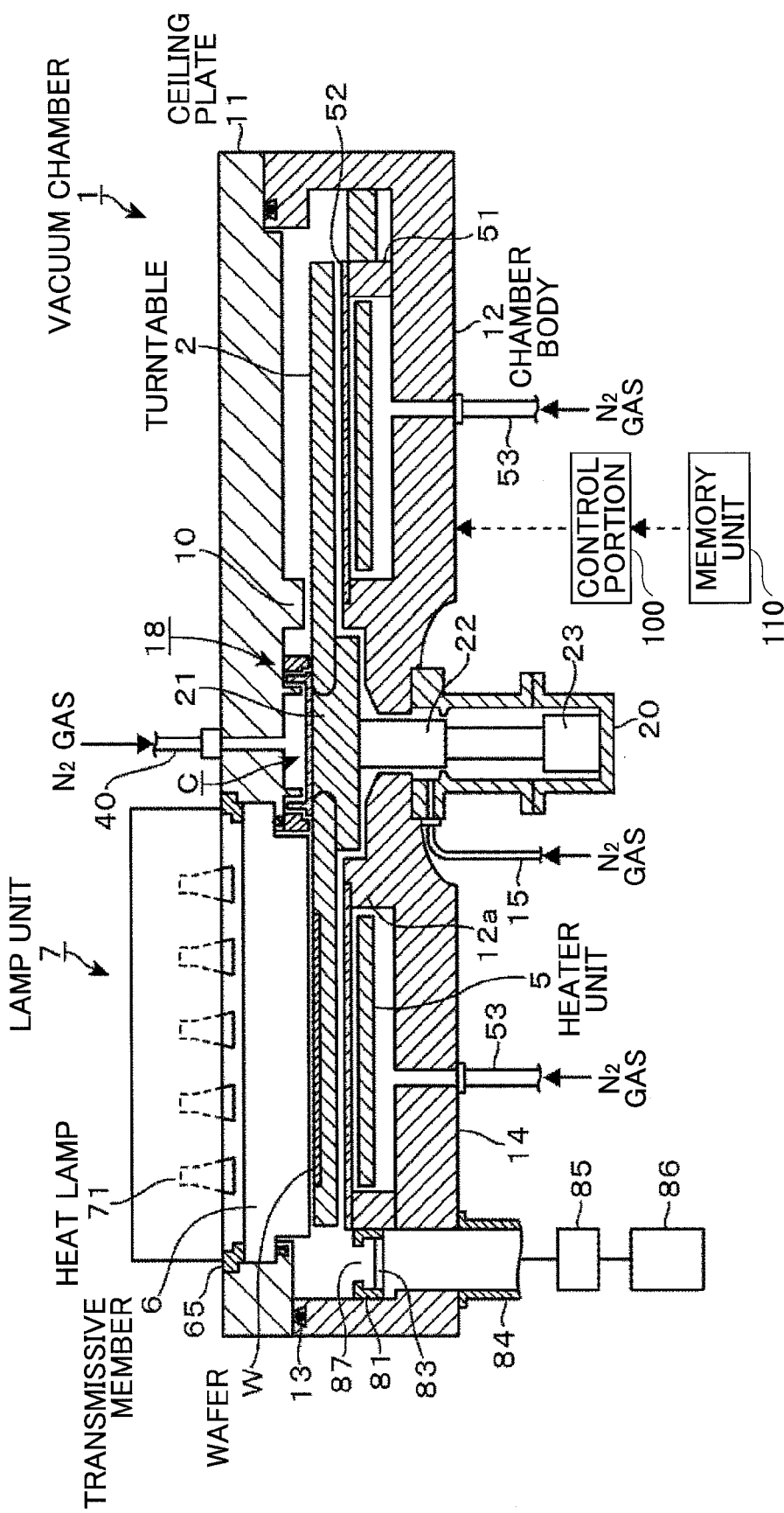
FIG. 1 is a vertical cross-sectional view illustrating an exemplary film deposition apparatus of first embodiment.
Figure 2:
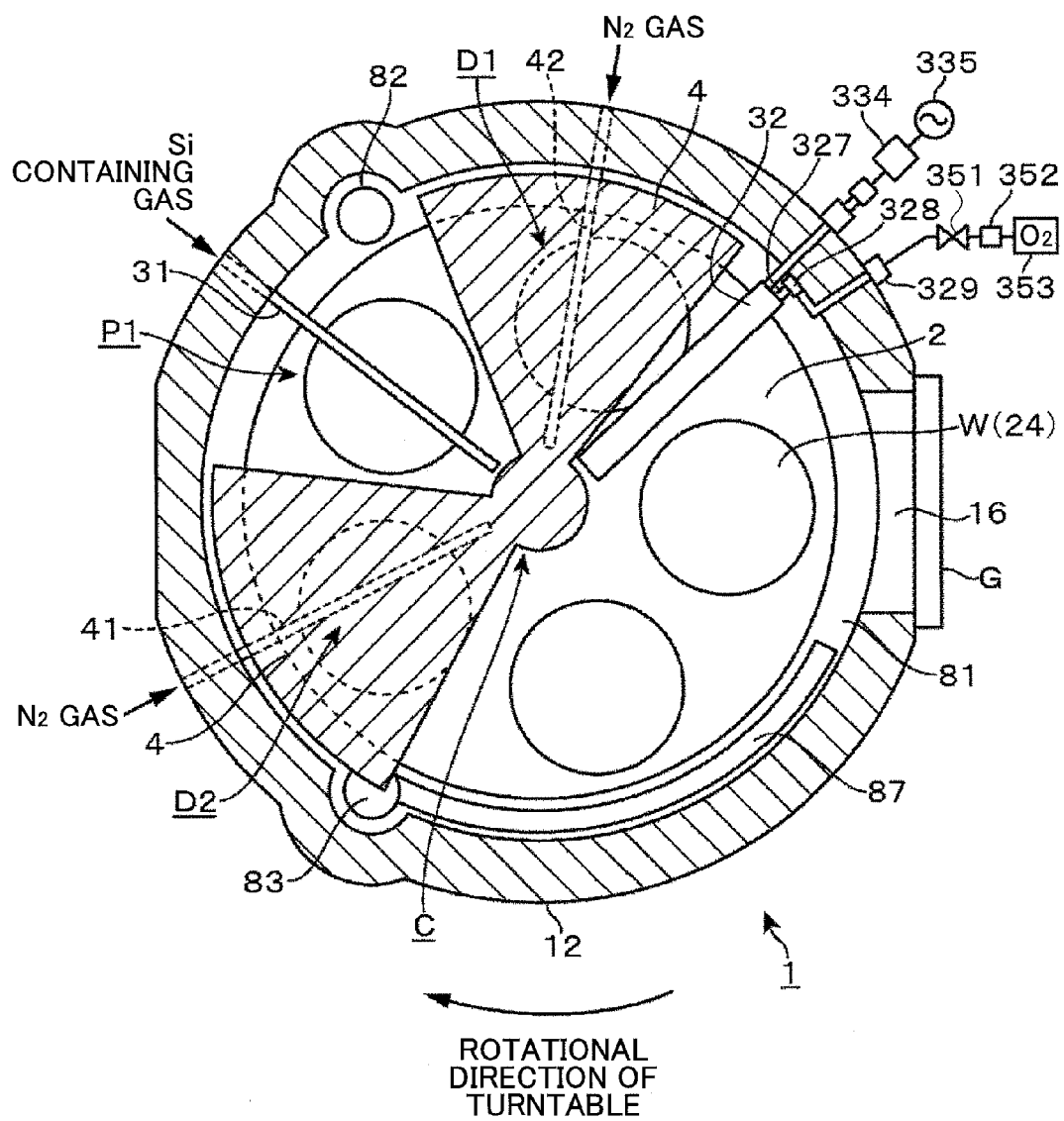
FIG. 2 is a horizontal cross-sectional plan view of the film deposition apparatus.

Referring to FIGS. 1 and 2, the film deposition apparatus of the first embodiment includes a vacuum chamber 1 substantially in a circular shape in its plan view and a turntable 2, which is accommodated in the vacuum chamber 1 and has a rotation center in a center of the vacuum chamber 1. The vacuum chamber 1 includes a ceiling 11 and a chamber body 12. The ceiling 11 is configured to be attachable to or detachable from the chamber body 12. A separation gas supplying tube 40 is connected to a center portion on an upper surface side of the ceiling plate 11. The separation gas supplying tube 40 is a means for supplying a nitrogen ($N_2$) gas as a separation gas to restrict different process gases from being mixed in a center area C inside the vacuum chamber 1. Referring to FIG. 1, a reference symbol 13 provided along a peripheral edge portion on an upper surface of the chamber body 12 is a sealing member. The sealing member 13 is, for example, an O ring.

A center portion of turntable 2 is fixed to a core portion 21 substantially in a cylindrical shape. A rotational shaft 22 extending in a vertical direction is connected to the lower surface of the core portion 21. In this example, the turntable 2 is freely rotatable in a clockwise direction around a vertical axis by the rotational shaft 22. The turntable 2 is made of quartz. Referring to FIG. 1, the reference symbol 23 designates a driving mechanism causing the rotational shaft to rotate around the vertical axis. The reference symbol 20 designates a case body accommodating the rotational shaft 23 and the driving mechanism 23. In order to improve throughput, it is preferable to rotate the turntable 2 at a rotational speed of 60 rpm or faster. A flange portion of the case body 20 on an upper surface side of the case body 20 is hermetically attached to the lower surface of a bottom portion 14 of the vacuum chamber 1. A purge gas supplying pipe 15 is connected to a lower area of the turntable 2 so as to supply a $N_2$ gas as a purge gas. The outer peripheral side of the core portion 21 in the bottom portion 14 of the vacuum chamber 1 is formed like a ring-shaped protrusion portion 12a in the vicinity of the lower side of the turntable 2.

Figure 3:
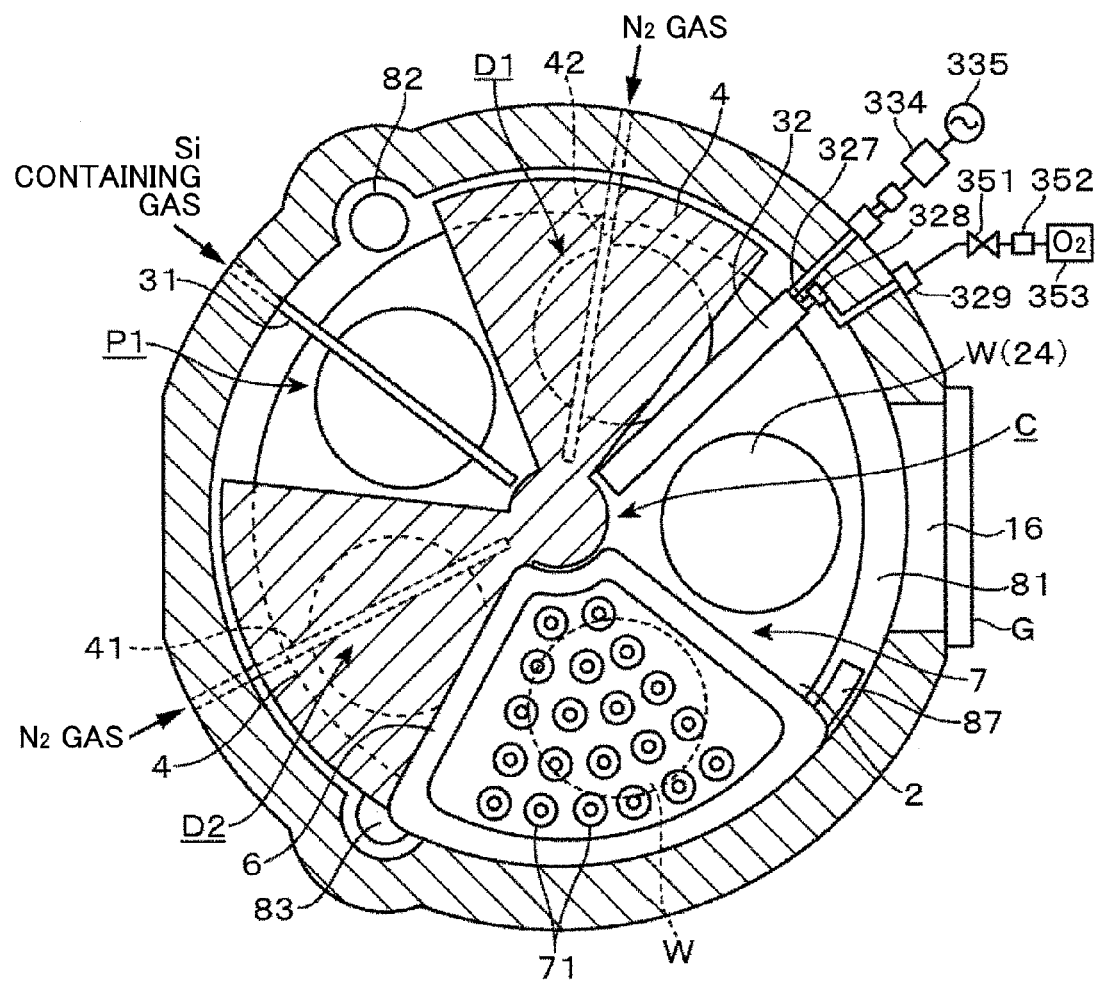
FIG. 3 is a horizontal cross-sectional plan view of the film deposition apparatus.

Referring to FIGS. 2 and 3, circular concave portions 24 for receiving a plurality of wafers W, for example 5 wafers, are formed as substrate mounting areas shaped like circles along a rotational direction (a peripheral direction) of the turntable 2. Each of the circular concave portions 24 is designed to have a diameter and a depth to enable the surfaces of the wafers W to be aligned on the surface of a portion of the turntable 2 where the wafers W are not mounted when the wafers W, whose diameter is, for example 300 mm, are dropped (accommodated) into the circular concave portions 24. As described later, a through hole (not illustrated) through which a lift pin penetrates the bottom surface of each of the circular concave portions 24 is formed. The lift pin pushes the wafer W on the lower side of the wafer W. Referring to FIG. 2, a lamp unit 7 (described later) is detached. Referring to FIG. 3, the lamp unit 7 is attached.

Referring to FIGS. 2 and 3, three nozzles 31, 41, and 42 made of quartz are provided at positions facing locus areas where the circular concave portions 24 on the turntable 2 are orbitally revolved. These nozzles 31, 41, and 42 are radially arranged in the peripheral direction (the rotational direction of the turntable 2) of the vacuum chamber 1 while the nozzles 31, 41, and 42 are separated by intervals. These nozzles 31, 41, and 42 are attached to an outer peripheral wall of the vacuum chamber 1 so as to horizontally extend toward the center area C while facing the wafers W. In this example, the separation gas nozzle 41, the process gas nozzle 31, and the separation gas nozzle 42 are arranged in a clockwise direction (in the rotational direction of the turntable 2) from a delivery port 16 (described below). These nozzles 31, 41, 34, 41 and 42 are located over the turntable 2 interposing a distance between the lower sides of the nozzles 31, 41, 34, 41 and 42 and the upper surface of the turntable 2 of, for example, about 1 mm to 5 mm.

The process gas nozzle 31 is a first process gas supplying portion, and the separation gas nozzles 41 and 42 are separation gas supplying portions. The nozzles 31, 41, and 42 are connected to corresponding gas supplying source (not illustrated) via flow rate adjusting valves. Said differently, the process gas nozzle 31 is connected to the gas supplying source for supplying the first process gas, which is a gas containing Si (hereafter, refereed to as a "Si containing gas"). The first process gas is, for example, a supplying source of a gas of tri(dimethylaminosilane) (3DMAS), namely $Si(N(CH_3)_2)_3H$. The first process gas can be a raw gas of the silicon dioxide film. The separation gas nozzles 41 and 42 are connected to corresponding gas supplying sources for supplying a separation gas, namely a $N_2$ gas. A plurality of gas discharge ports (see FIG. 12) is formed on the lower surfaces of the gas nozzles 31, 41, and 42 along radius directions of the turntable 2. For example, the intervals between the gas discharge ports 33 are equal.

Figure 4:
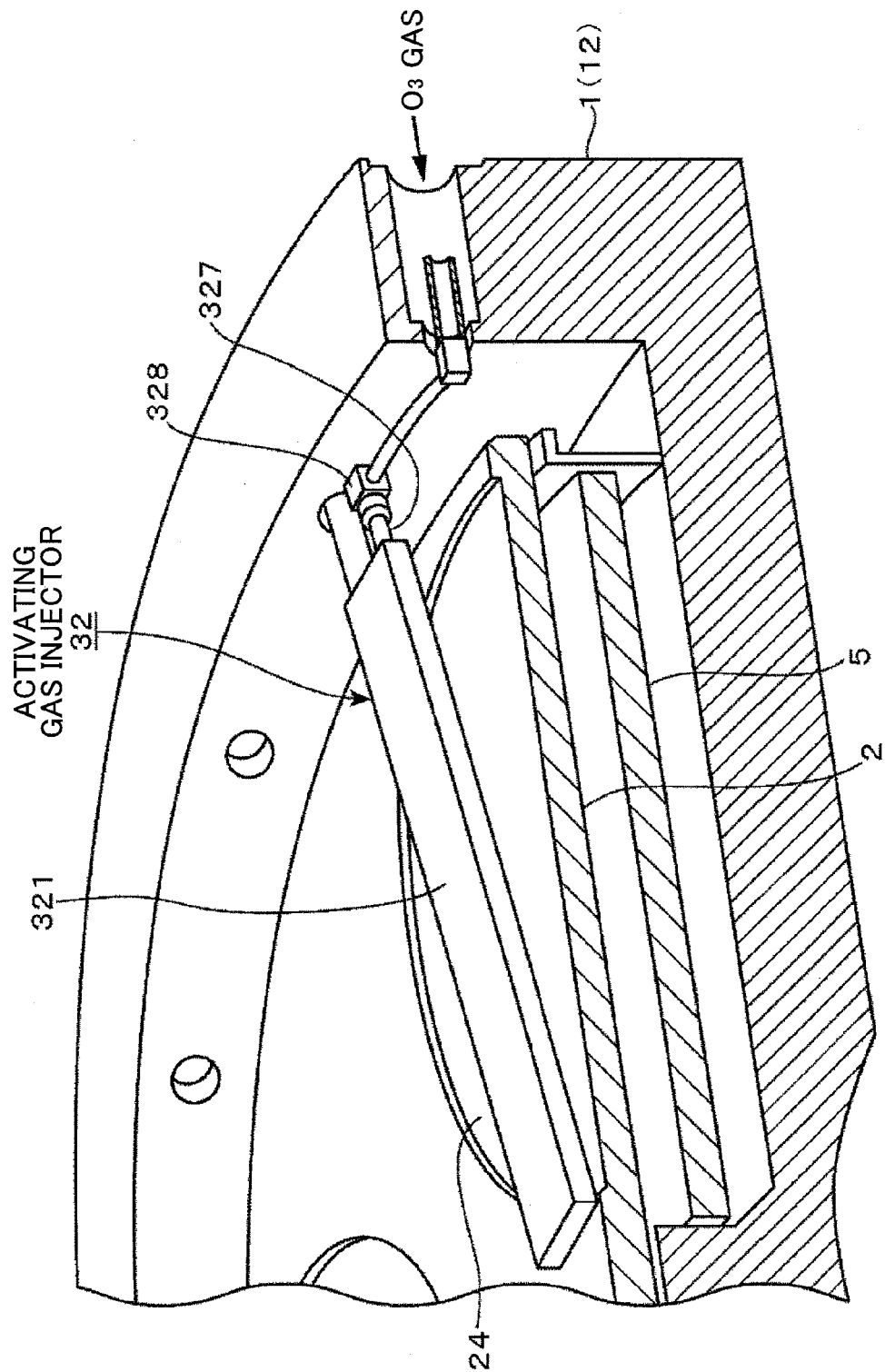
FIG. 4 is a perspective view illustrating a part of the film deposition apparatus.
Figure 5:
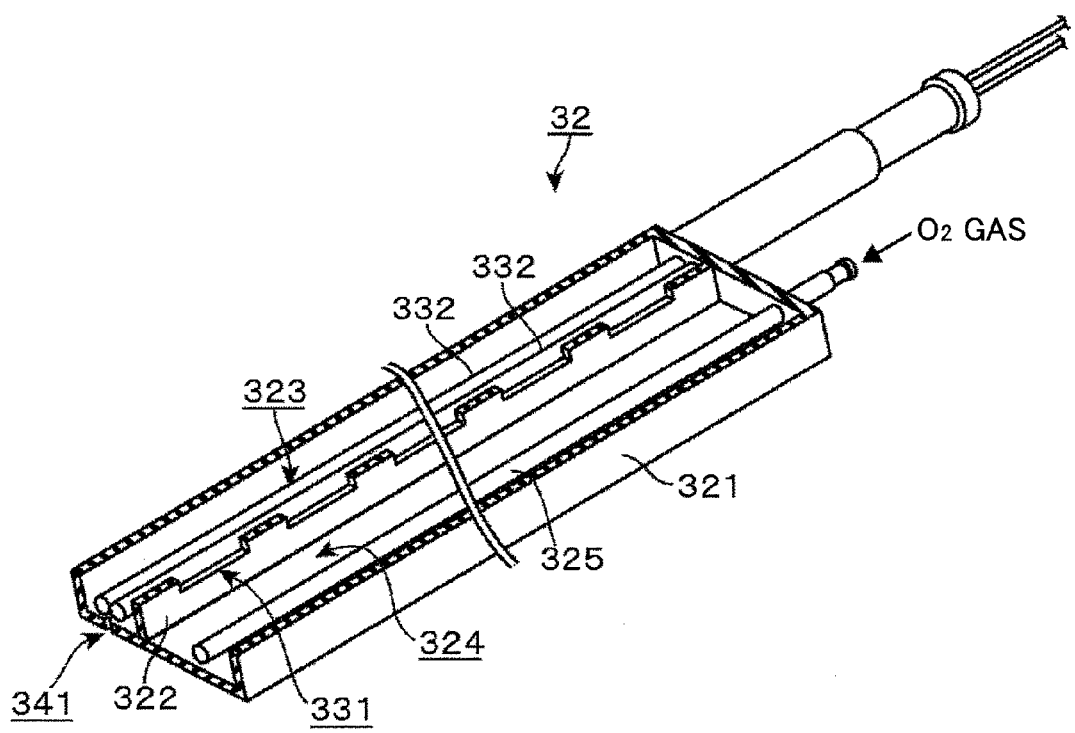
FIG. 5 is a perspective view of an activating gas injector provided in the film deposition apparatus.
Figure 6:
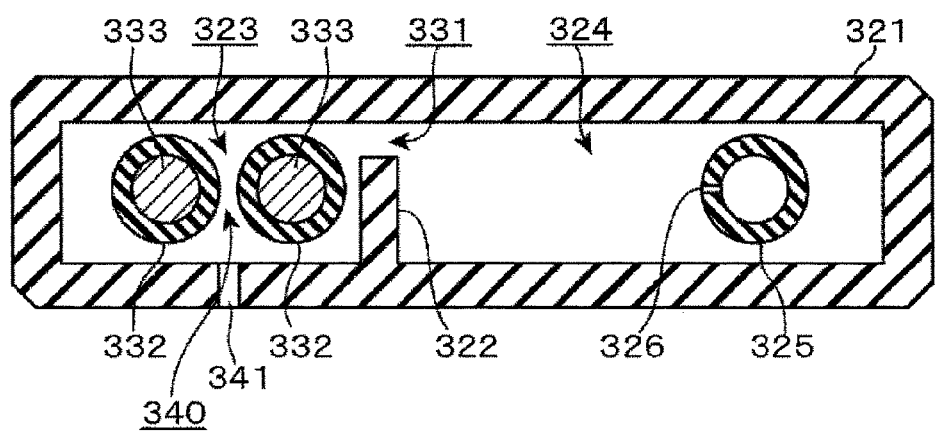
FIG. 6 is a vertical cross-sectional view illustrating an exemplary film deposition apparatus.

An activating gas injector 32 is provided on the downstream side of the separation gas nozzle 42 along the rotational direction of the turntable 2 and on the upstream side of the separation gas nozzle 41 along the rotational direction of the turntable 2. Referring to FIGS. 4 to 6, the activating gas injector 32 includes an injector main body 321 having a casing. Inside the injector main body 321, two spaces having different widths and being partitioned along the length direction are formed. One of the spaces is formed as a gas activating chamber 323 being a gas activating path for changing the process gas to plasma (activating). The other one of the spaces is formed as a gas introducing chamber 324 being a gas introducing path for supplying the process gas to the gas activating chamber 323.

Referring to FIGS. 2 to 6, a reference symbol 325 designates a gas introducing nozzle, a reference symbol 326 designates a gas aperture, a reference symbol 327 designates a gas introducing port, a reference symbol 328 designates a joint portion, and a reference symbol 329 designates a gas supplying port. A process gas to be changed into plasma is discharged from the gas aperture 326 of the gas introducing nozzle 325 and is supplied into the inside of the gas introducing chamber 324. Next, the activating gas injector 32 is configured such that the process gas flows from the gas introducing chamber 324 through a cutout portion 331 formed on an upper portion of the partition wall 322 into the gas activating chamber 323. Inside the gas activating chamber 323, two sheath tubes 332, 332 made of dielectric material, for example ceramics, extend along the partition wall 322 from a root side to a tip side. Rod-like electrodes 333, 333 are inserted into the insides of the sheath tubes 332, 332, respectively. The root sides of the rod-like electrodes 333, 333 are drawn out of the injector main body 321. The root sides are connected through a matching box 334 with the high-frequency power source 335 on the outside of the vacuum chamber 1.

Gas discharging ports 341 are arranged in the length direction of the injector main body 321 and on the bottom surface of the injector main body 321. The plasma generated and activated by a plasma generating portion 340, which is an area between the rod-like electrodes 333, 333, is discharged from the gas discharging ports 341. The tip side of the injector main body 321 extends toward the center portion of the turntable 2. Referring to FIGS. 2 and 3, a reference symbol 351 designates a valve, a reference symbol 352 designates a flow rate adjusting portion, and a reference symbol 353 designates a gas source where the process gas, for example an oxygen ($O_2$) gas is stored.

In this activating gas injector 32, an $O_2$ gas is supplied as the process gas, and simultaneously high-frequency power is supplied from the high-frequency power source 335 to the plasma generating portion 340 (rod-like electrodes 333, 333). Meanwhile, the inside of the vacuum chamber 1 is a vacuum atmosphere. Therefore, the $O_2$ gas flown into an upper side of the gas activating chamber 323 is changed into plasma (activated). The obtained plasma (hereinafter, referred to as oxygen plasma) is supplied toward the wafers W through the gas discharging port 341. The oxygen plasma corresponds to a second process gas containing active species obtained by activating oxygen by an electric field.

Figure 12:
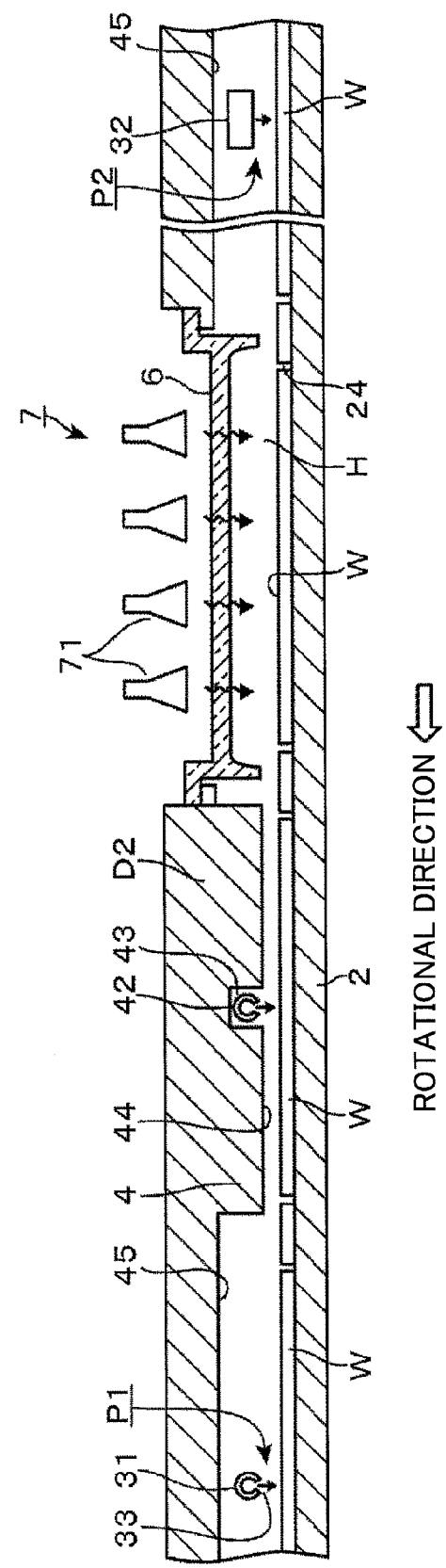
FIG. 12 is a vertical cross-sectional view illustrating a process area, a decomposing area, and a heating area in the film deposition apparatus.

A first process area P1 is formed in a lower area of the process gas nozzle 31. In the first process area P1, the first process gas is absorbed by the wafers W. A second process area P2 is formed in the lower area of the activating gas injector 32. In the second process area P1, the second process gas is supplied to the first process gas absorbed on the surfaces of the wafers W. The separation gas nozzles 41 and 42 are provided to form separating areas D for separating the first process area P1 and the second process area P2. In the following explanation, one of the separating areas D located on the downstream side of the rotational direction of the turntable 2 is designated as a first separating area D1. The other one of the separating areas D located on the upstream side of the rotational direction of the turntable 2 is designated as a second separating area D2. Referring to FIGS. 2 and 3, convex portions 4 shaped like a sector in their plan views are formed on portions of the ceiling plate 11 of the vacuum chamber 1 corresponding to the separating areas D1 and D2. Referring to FIG. 12, the separation gas nozzles 41 and 42 are accommodated inside groove portions 43 formed in the convex portions 4. Therefore, referring to FIG. 12, a ceiling surface (first ceiling surface) 44, which is the lower surfaces of the convex portions 4, is provided on both sides of each separation gas nozzle 41, 42 in the peripheral directions of the turntable 2 to prevent the first and second process gases from being mixed. On the other hand, a ceiling surface (the second ceiling surface) 45 higher than the ceiling surface 44 is provided in an area without the convex portions 4 of the ceiling plate 11.

Referring to FIG. 1, in a space between the turntable 2 and the bottom portion 14 of the vacuum chamber 1, a heater unit 5 is provided. The heater unit 5 is a main heating mechanism. By heating the turntable 2, the wafers W are heated from their lower sides through the turntable 2. In this example, radiation heat generated by the heater unit 5 is absorbed by the turntable 2 made of quartz. Thus, the turntable 2 is heated. The maximum temperature of the turntable 2 permitted in consideration of the performance of the film deposition apparatus, namely a permissible maximum temperature, is set to be a temperature lower than a temperature, at which an ozone gas is thermally decomposed before the ozone gas reaches the turntable 2. Said differently, when the turntable 2 is heated by the heater unit 5 without being heated by an auxiliary heating mechanism (described later), the temperature of the substrate mounting area is set to a temperature lower than the temperature, at which the ozone gas is thermally decomposed before the ozone gas reaches the turntable 2. The permissible maximum temperature of the turntable 2 is set in consideration of heatproof temperatures of, for example, a sealing member (an O ring 13) made of fluorine-containing rubber and/or a sealing member (not illustrated) of the gas nozzles 31, 41, and/or 42. Referring to FIG. 1, a side of the heater unit 5 is covered by a cover member 51, and an upside of the heater unit 5 is covered by a cover plate 52. Purge gas supplying pipes 53 for purging areas where the heater units 5 are arranged are provided at a plurality of positions under the heater units 5. The purge gas supplying pipes 73 are arranged in the peripheral directions of the bottom portion 14 of the vacuum chamber 1.

Here, the temperature at which the ozone gas is thermally decomposed is described. The film deposition apparatus of the first embodiment belongs to a type in which oxygen plasma is generated using an activating injector 32. On the contrary, in a case where a film deposition apparatus belonging to a type in which ozone is used instead of the oxygen plasma is structured using components of the above film deposition apparatus of the first embodiment other than the auxiliary heating mechanism and the activating injector 32, a gas nozzle (an injector) is arranged so as to extend from a peripheral edge side of the turntable 2 to the center portion of the turntable 2 in a manner similar to the process gas nozzle 31. In this case, because the gas nozzle for ozone extends on the upside of the turntable 2, the gas nozzle for ozone is heated by heat from the turntable 2. When the temperature of the substrate mounting area of the turntable 2 is heated at 630° C., the temperature of the gas nozzle becomes about 530° C. Therefore, the temperature of the ozone gas inside the gas nozzle becomes about 530° C. On the other hand, oxidation of a Si containing gas with an ozone gas is immediately performed at a time of supplying the ozone gas. Therefore, even if the temperature of the substrate mounting area exceeds the temperature (550° C.), at which the ozone gas is thermally decomposed, the ozone gas is thermally decomposed to be oxygen and reacts with the Si containing gas before the oxidation power decreases. As described, the case where the ozone gas is not thermally decomposed occurs when the ozone gas is not thermally decomposed before the ozone gas reaches the substrate mounting area. Therefore, the above temperature lower than the temperature, at which the ozone gas is thermally decomposed, means that the turntable 2 is heated at a temperature not causing the thermal decomposition before the ozone gas actually supplied from the gas nozzle reaches the substrate mounting area. Therefore, the temperature is practically changed depending on a distance between the gas nozzle and the turntable 2, the shape or material of the gas nozzle, the temperature of the ozone gas supplied to the gas nozzle, or the like. Therefore, if the temperature of the turntable 2 (substrate mounting area) is set to 630° C. or higher, for example 650° C., there may be a case where the ozone gas supplied from the gas nozzle is not thermally decomposed before the ozone gas reaches the substrate mounting area. Therefore, in this example, the temperature of the turntable 2 is set to 550° C. through 650° C.

Figure 7:
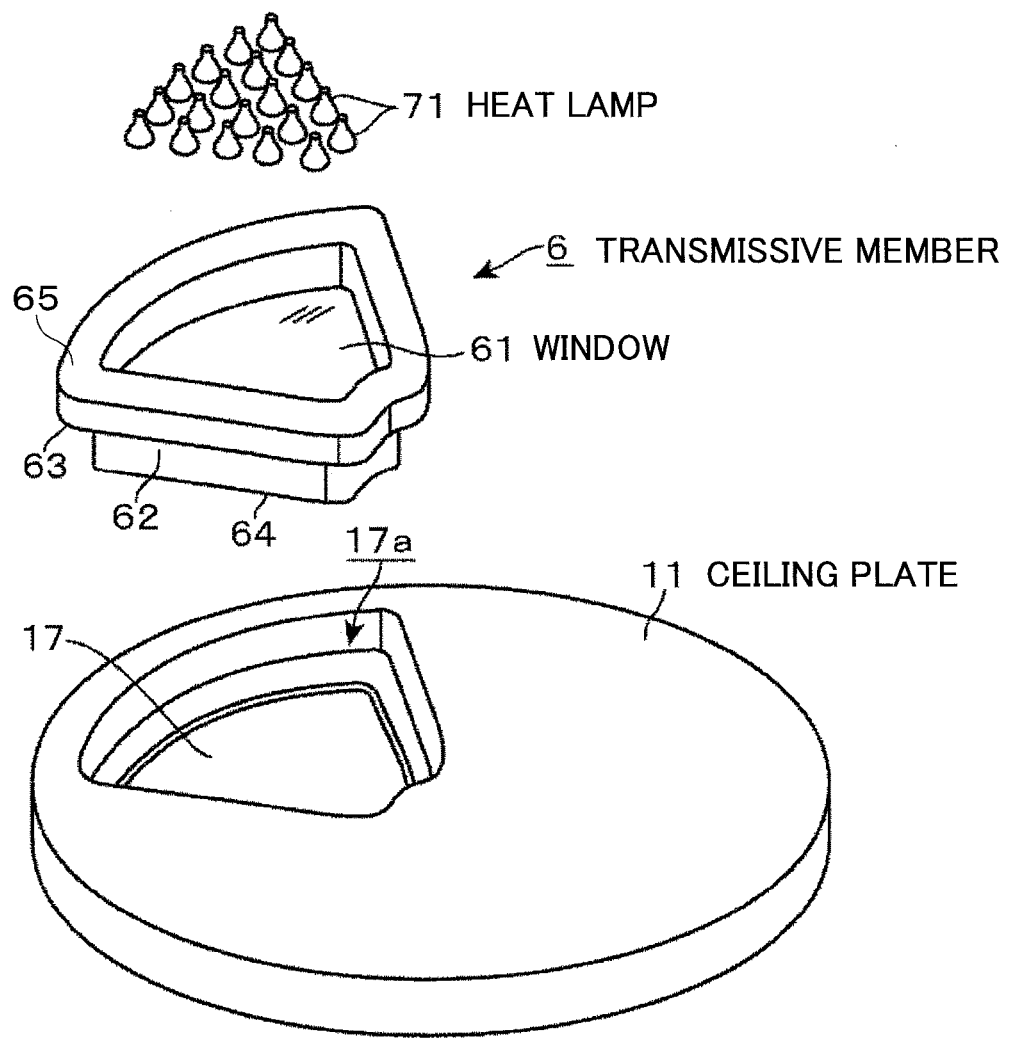
FIG. 7 is an exploded perspective view illustrating apart of an inside of the film deposition apparatus.

Further, a transmissive member 6 is provided in the ceiling plate 11. The lamp unit 7 is arranged on the upside of the transmissive member 6. For example, the lamp unit 7 and the transmissive member 6 are located at a position slightly closer to the activating gas injector 32 from the second separating area D2 on the downstream side in the rotational direction of the turntable 2 relative to the second separating area D2. Referring to FIG. 7, for example, an opening portion 17 substantially shaped like a sector in its plan view is formed to attach the transmissive member 6 to the ceiling plate 11. For example, the opening portion 11a formed in the ceiling plate 11 is formed between a position apart by about 60 mm from the rotation center of the turntable 2 and a position apart by about 80 mm from the outer edge of the turntable 2. Further, an end portion of the opening portion 17 is inward recessed in an arc shape along the outer edge of a labyrinth structure on a center side of the turntable in its plan view. This structure of the opening portion 17 is to prevent the opening portion 17 from interfering the labyrinth structure 18 (described later) provided in the center area C of the vacuum chamber 1.

Figure 8:
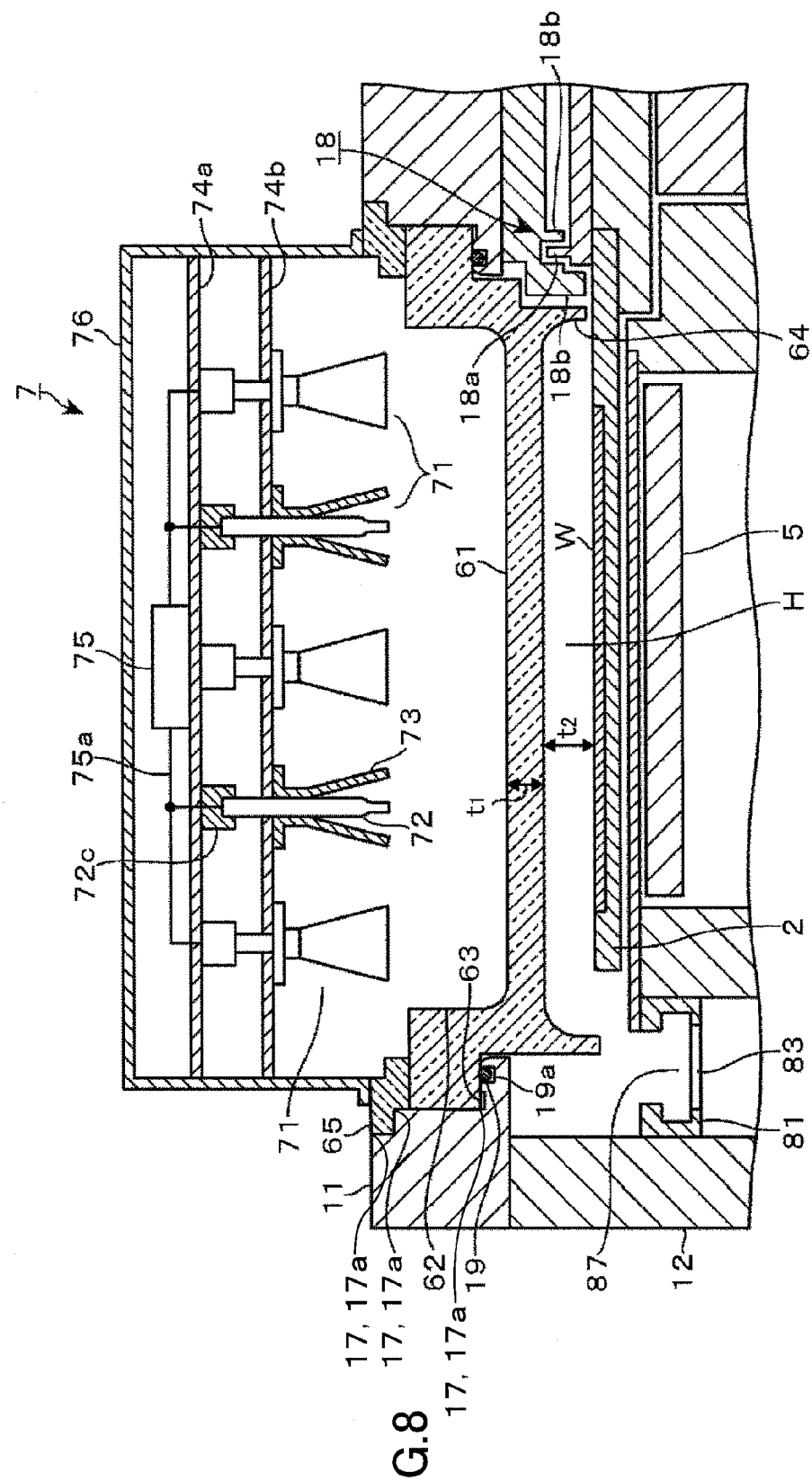
FIG. 8 is a vertical cross-sectional view illustrating a part of the film deposition apparatus.

Referring to FIG. 8, the opening portion 17 is formed by three step portions 17a. Opening sizes of three step portions 17a gradually decrease from the upper surface side of the ceiling 11 to the lower surface side of the ceiling 11. Among the step portions 17a, a groove 19a is formed on the upper surface of the lowermost step portion (an innermost step) 17a. For example, a sealing member, for example an O-ring 19, is provided inside the groove 19a. The O-ring 19 is made of a material having heat resistance, for example, perfluoroelastomer. For the convenience of the illustration in FIG. 7, the step portions 17a have two steps. The groove 19a, the O-ring 19, and a pressing portion 65 (described later) are omitted from the illustration.

The transmissive member 6 is made of a material, which allows transmission of a near infrared ray, such as quartz. The transmissive member 6 is engaged with the opening portion 17. Referring to FIGS. 7 and 8, the transmissive member 6 includes a window 61 which is horizontally arranged. The peripheral edge portion of the window 61 upward stands along the periphery of the transmissive member 6 thereby forming a side wall portion 62. A flange portion 63 is formed on the upper end of the side wall portion 62 so as to horizontally and outward extend along the periphery of the side wall portion 62. Referring to FIG. 8, an outer edge portion on the lower side of the transmissive member 6 vertically and downward extends along the periphery of the transmissive member 6 thereby forming a curtain portion 64 for regulating gases. By the curtain portion 64, an $N_2$ gas, oxygen plasma, or the like are prevented from intruding into a lower area of the transmissive member 6 thereby restricting film formation on the window 61.

When the transmissive member 6 is dropped into the opening portion 17, the flange portion 63 fits in the lowermost step portion 17a of the step portions so that the flange portion 63 and the lowermost step portion 17a are mutually secured. The step portion 17a (the ceiling plate 11) is hermetically connected with the transmissive member 6 by the O-ring 19. The pressing portion 65 in a frame-like shape is provided on the upper side of the transmissive member 6 along the outer edge of the opening portion 17. When the entire periphery of the flange portion 63 is downward pushed at the pressing portion 65 and the pressing portion 65 is fixed to the ceiling plate 11 by a bolt (not illustrated), an internal atmosphere of the vacuum chamber 1 is hermetically set.

Referring to FIGS. 3 and 8, the size and shape of the transmissive member 6 are determined so as to cover the entire surfaces of the wafers W when the wafers W are positioned below the transmissive member 6. For example, the thickness t1 of the window 61 is 20 mm. Further, a distance between the inner wall surface of the transmissive member 6 on the side of the center area C and the outer edges of the wafers W are set to 70 mm. A distance between the inner wall surface of the transmissive member 6 on the side of the outer edge of the turntable 2 and the outer edges of the wafers W is set to 70 mm. Further, a distance t2 between the lower surface of the window 61 of the transmissive member 6 and the surfaces of the wafers W on the turntable 2 is 4 mm to 60 mm. In this example, the distance t2 is 30 mm. Furthermore, a distance between the lower end of the curtain portion 64 of the transmissive member 62 and the surface of the turntable 2 is, for example, 0.5 mm to 4 mm. In this example, the distance is 2 mm.

The lamp unit 7 includes a great number of heat lamps 71. The heat lamps 71 form the auxiliary heating mechanism. The heat lamps 71 directly heat the wafers W, which are heated by the heater unit 5, by irradiating the wafers W with light in an absorption wavelength range. Thus, the wafers W are heated by radiation heat caused by the irradiated light to have a processing temperature equal to or higher than a temperature, at which the ozone gas is thermally decomposed. The processing temperature is equal to or higher than the temperature, at which the ozone gas is thermally decomposed, and is a temperature without causing thermal decomposition of the first and second process gases, and also is a temperature at which heat resistance of the film deposition apparatus is influenced even if the wafers W are heated to have the processing temperature.

Figure 9:
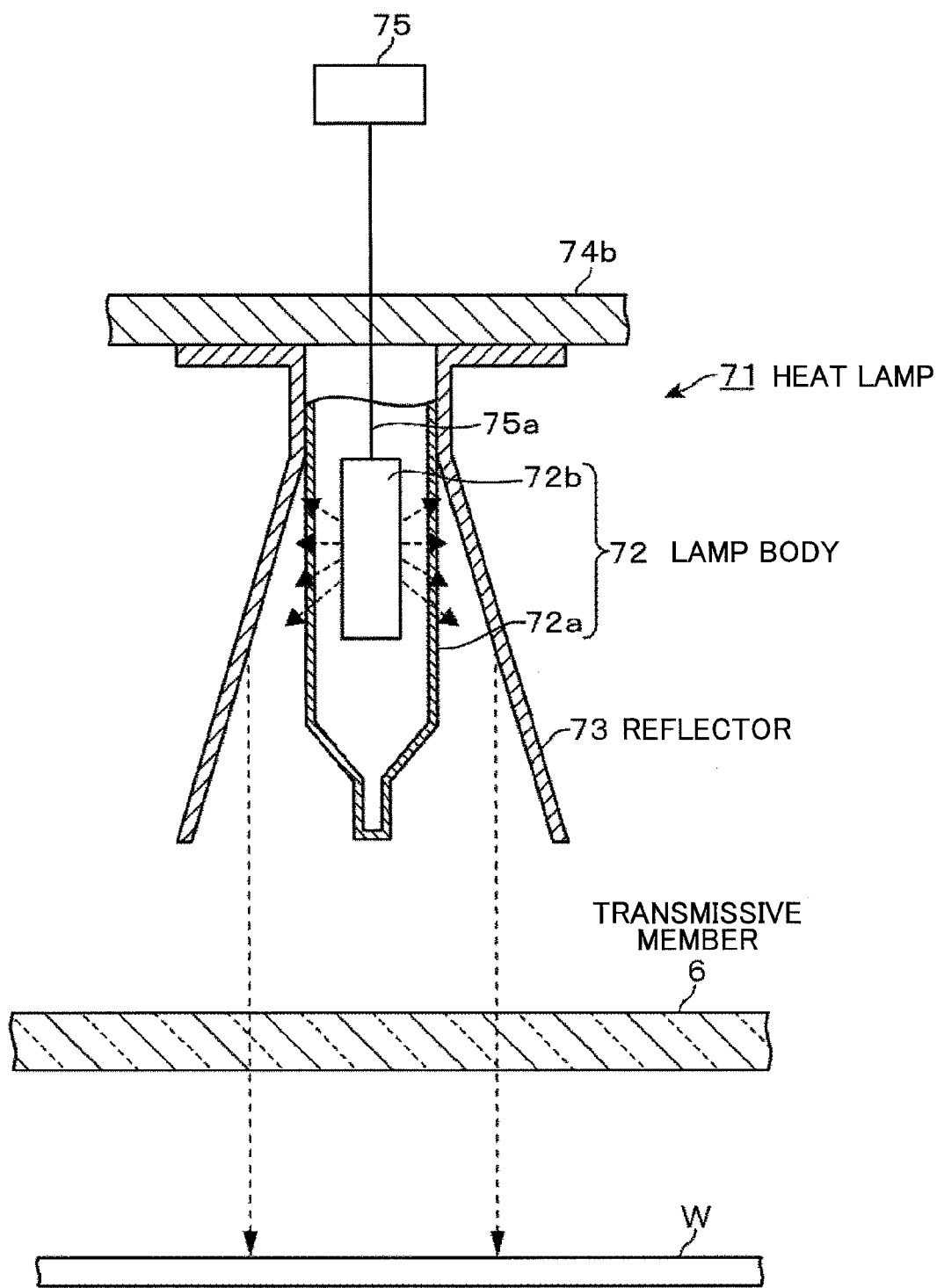
FIG. 9 is a vertical cross-sectional view of a part of a lamp unit provided in the film deposition apparatus.

For example, referring to FIG. 9, the heat lamp 71 includes a lamp body 72 including a glass body 72a and a light source 72b (a radiant source) formed inside the glass body 72a, and a reflector 73 provided around the lamp body 72. The light source 72b radiates infrared light. The infrared light has an absorption wavelength range where the infrared light is absorbed by the material (silicon) forming the wafers W after being transmitted (passing) through the material (quartz) forming the transmissive member 6.

Specifically, the lamp body 72 is a halogen lamp emitting infrared light having a wavelength of, for example, 0.5 µm or greater and 3 µm or smaller. In this example, the wavelength range of the infrared light from the lamp body 72 is set to a range where the infrared light is absorbed by silicon forming the wafer and is transmitted through quartz forming the turntable 2. The reflector 73 is provided to reflect the infrared light from the light source 72b so as to direct a side of the turntable 2 (a downward side). The reflector 73 is formed in, for example, a conic shape gradually spreading toward the turntable 2 so that light energy from the light source 72b efficiently irradiates (is transferred to) the wafers W. Gold plating is provided on the inner wall of the reflector 73. Further, because the light energy from the light source 72b irradiates (is transferred to) the wafers W using the reflector 73, diffusion of radiation heat in a direction to other than the wafers W can be restricted.

Referring to FIG. 8, the heat lamps 71 are supported by supporting members 74a and 74b and arranged on the upper side of the transmissive member 6. Specifically, the lamp body 72 is attached to the first supporting member 74a through an electrode portion 72c, which is formed on one end of the lamp body in its longitudinal direction. The reflector 73 is attached to the second supporting member 74b. The heat lamps 71 are arranged so that the lengths of the lamp bodies 72 are horizontally aligned. Referring to FIG. 5, a power source portion 75 is provided to supply electricity to the electrode portions 72c of the lamp bodies 72 through a power supply line 75a.

Figure 10:
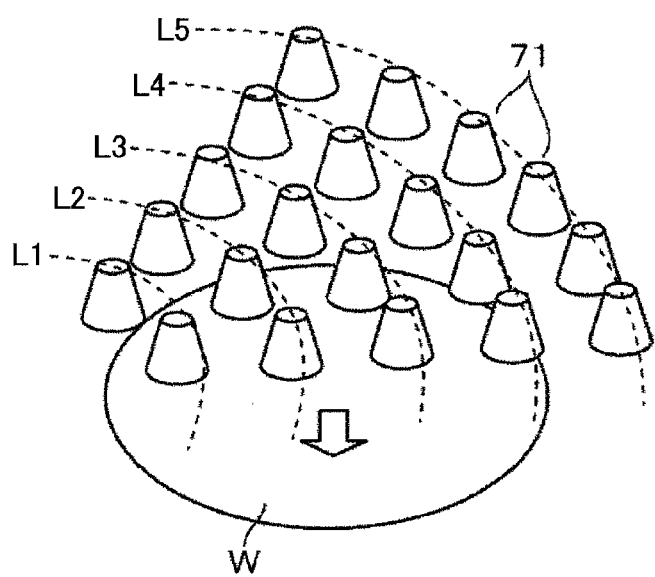
FIG. 10 is a perspective view schematically illustrating a heat lamp of a lamp unit.

In this example, the sizes (capacities) of the heat lamps 71 are the same. Referring to FIG. 10, the heat lamps 71 are arranged along lines L1 to L5 of concentric circles whose center is the rotation center of the turntable 2. The numbers of the heat lamps 71 arranged on the lines L1 to L5 increase from the center of the turntable 2 toward the outer edge of the turntable 2. The power supplies to these heat lamps 71 are controlled so that wafers W are heated to have a processing temperature preferable for a heating process (described later) based on a measurement result obtained by the temperature detecting portion such as a thermo couple (not illustrated).

As described, the temperature distribution in a heating area H (see FIG. 12) formed on the lower side of the lamp unit 7 can be controlled by adjusting the number of the heat lamps 71, the arrangement of the heat lamps 71, and the power supplies to the heat lamps 71. When the turntable 2 rotates, the peripheral velocity in the center portion is faster than the peripheral velocity in the outer edge. In this example, the number of the heat lamps 71 in the outer edge is greater than the number of the heat pumps 71 in the center portion to secure a greater heat quantity in the outer edge of the turntable 2 than that in the center portion of the turntable 2. Thus, the heat quantities supplied to the wafers W are balanced in radius directions of the turntable 2. Further, the amount of radiation (an output) of the heat lamps 71 is changed even the same electric power is supplied to the heat lamps 71 by changing the capacities of the heat lamps 71. Thus, the temperature distribution in the heating area H can be controlled.

Figure 11:
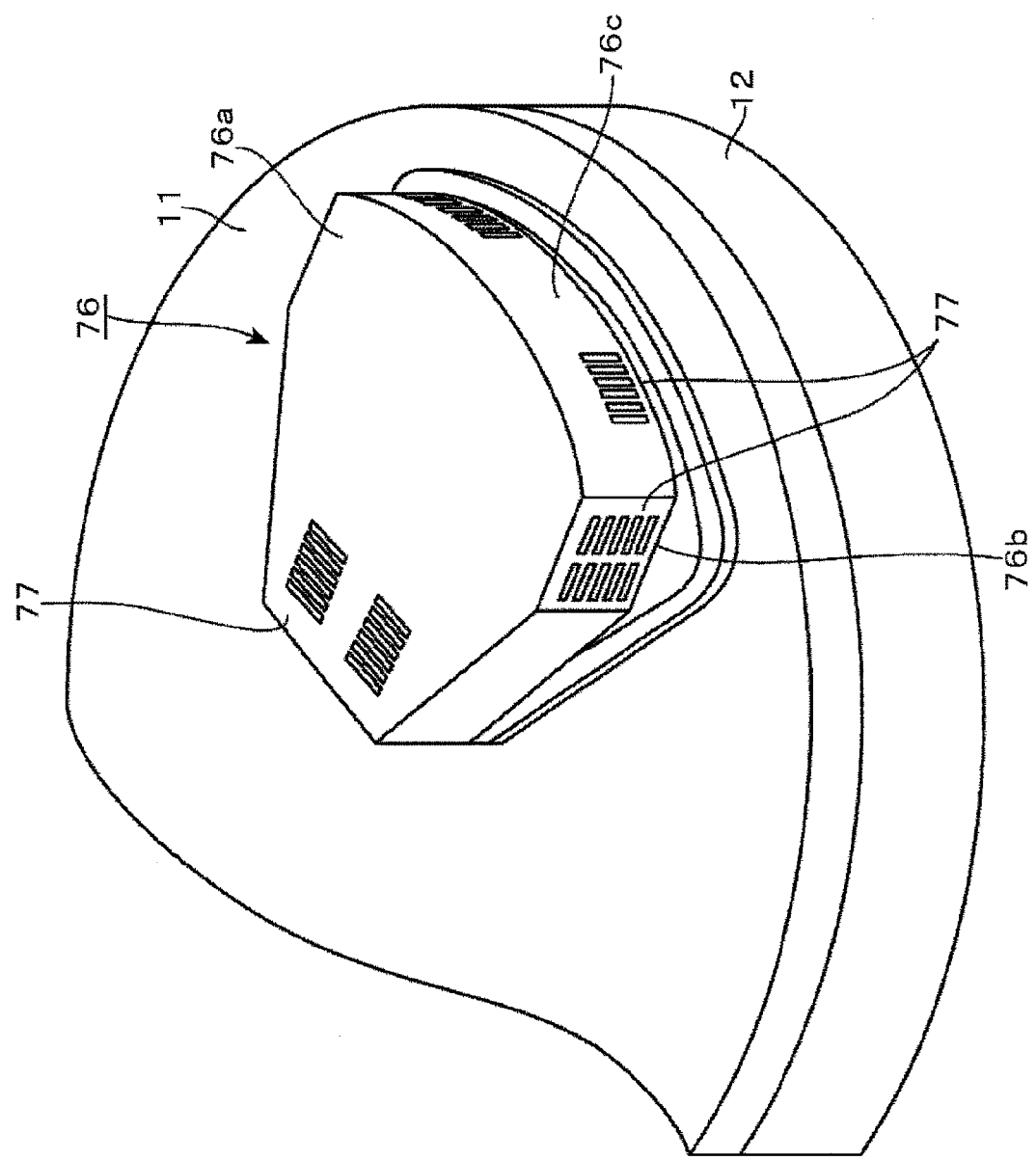
FIG. 11 is a perspective view illustrating a part of the film deposition apparatus.

An area where the heat lamps 71 are provided is covered by a cover member 76 as illustrated in FIGS. 8 and 11. The cover member 76 is made of a material having heat resistance such as stainless. A great number of slits 77 for heat radiation are formed in, for example, an upper wall 76a and side walls 76b and 76c of the cover member 76.

As described, the wafers W are heated from the upper sides of the wafers W by the heat lamps 71 of the lamp unit 7 while the turntable 2 is heated by the heater unit 5 to be a temperature, for example, 600° C., lower than a temperature, at which the ozone gas is thermally decomposed before the ozone gas reaches the substrate mounting area on the turntable 2. Therefore, the wafers W are heated to have the processing temperature equal to or higher than the temperature, at which the ozone gas is thermally decomposed, for example, 700° C. Because the turntable 2 transmits infrared light from the heat lamps 71, the temperature of the turntable 2 is restricted from increasing.

Subsequently, various portions of the vacuum chamber 1 are described. Referring to FIGS. 2 and 3, a delivery port 16 is formed in a side wall of the vacuum chamber 1. The delivery port 16 is provided to send or receive wafers W between a transfer arm (not illustrated) located outside the delivery port 16 and the turntable 2. The delivery port 16 can be opened or hermetically closed using a gate valve G. When the circular concave portions 24 of the turntable 2 are positioned to face the delivery port 16, the wafers W are sent to or received from the transfer arm. Therefore, a lift pin (not illustrated) configured to penetrates through the circular concave portion 24 for lifting each wafer W from the back side of the wafer W to send and receive the wafer W at a portion of the turntable 2 corresponding to the sent and received position, and a lifting and lowering mechanism (not illustrated) are provided on the lower side of the turntable 2.

Referring to FIGS. 2 and 8, a side ring 81 is arranged at a position slightly lower than the turntable 2 on the outer edge side of the turntable 2. The side ring 81 is provided to protect the inner wall of the vacuum chamber 1 from a fluorochemical cleaning gas flown instead of the process gases used, for example, at a time of cleaning the film deposition apparatus. In this example, the separating area D and an area on the outer edge side of the transmissive member 6 are positioned (exposed) above the side ring 81. Between the outer peripheral portion of the turntable 2 and the inner wall of the vacuum chamber 1, an air flow path shaped like a circular concave is formed like a ring in the peripheral directions. An air flow (an evacuation gas flow) is formed in a lateral direction in the air flow path. Therefore, the side ring 81 is formed in the air flow path to prevent the inner wall surface of the vacuum chamber 1 from being exposed on the air flow path.

A first evacuation port 82 and a second evacuation port 83 are formed on the upper surface of the side ring 81 at different two positions so as to be apart in the peripheral directions. Said differently, the two evacuation ports are formed on the lower sides of the air flow path. The first and second evacuation ports 82 and 83 are formed in the side ring 81 at positions corresponding to the two evacuation ports. The first evacuation port 82 is formed between the process gas nozzle 31 and the separating area D1 on the downstream side of the process gas nozzle 31 in the rotational direction of the turntable 2 at a position closer to the separating area D1. The second evacuation port 83 is formed between the activating gas injector 32 and the separating area D2 on the downstream side of the activating gas injector 32 in the rotational direction of the turntable 2 at a position closer to the separating area D2. The first evacuation port 82 is provided to evacuate the first process gas and the separation gas. The second evacuation port 83 is provided to evacuate the second process gas and the separation gas. Referring to FIG. 1, the first and second evacuation ports 82 and 83 may be connected with a vacuum evacuating mechanism, for example, a vacuum pump 86 through evacuation tubes 84 having a pressure adjusting unit 85 such as a butterfly valve.

As described, because the transmissive member 6 is arranged from the center area C to the outer edge, the gases discharged on the upstream side of the transmissive member 6 in the rotational direction of the turntable 2 is prevented from flowing toward the second evacuation port 83 by the transmissive member 6. Therefore, a gas flow route 87 (FIG. 1) in a groove-like shape for flowing the second process gas and the separation gas is formed on the upper surface of the side ring 87 outside the transmissive member 6. Referring to FIG. 3, the gas flow route 87 is formed in an arc-like shape from a position closer to the activating gas injector 32 relative to the end portion of the transmissive member 6 on the upstream side in the rotational direction of the turntable 2 to the second evacuation port 83 described above.

Referring to FIG. 2, a ring-shaped protrusion portion 10 is provided at the center portion below the ceiling plate 11. The ring-shaped protrusion portion 10 is substantially shaped like a ring, and is continuously formed from a portion of the center area C of the convex portion 4. The lower surface of the ring-shaped protrusion portion 10 has the same height as the lower surface of the convex portion 4 (the first ceiling surface 44). Further, the labyrinth structure 18 is arranged on the upper side of a core portion 21, which is positioned on the rotation center side of the turntable 2 relative to the ring-shaped protrusion portion 10. The labyrinth structure 18 is provided to keep a flow path of gas and to prevent the first and second gas from being mutually mixed in the center area C. Referring to FIG. 8, the labyrinth structure 18 includes a first wall portion vertically extending from the turntable 2 to the ceiling plate 11 and a second wall portion vertically extending from the ceiling plate 11 to the turntable 2. The first wall portion 18a and the second wall portion 18b are formed in peripheral directions of the turntable 2 and of the ceiling plate 11, and are alternately arranged in the radius directions of the turntable 2.

The film forming deposition apparatus includes a control portion 100 having a computer for controlling entire operations of the film deposition apparatus. A program for performing a film deposition process and alternation is stored in a memory of the control portion 100. The program is made to perform steps of the following operations of the film deposition apparatus. The program is installed in the control portion 100 from a memory unit 110 being a recording medium such as a hard disk, a compact disk, a magneto-optical disk, a memory card, and a flexible disk.

Next, functions of the first embodiment are described. While the turntable 2 is heated by the heater unit 5, the gate valve G (see FIG. 2) is released. Through the delivery port 16, for example, five wafers are sequentially mounted on the turntable 2 by the transfer arm (not illustrated) while intermittently rotating the turntable 2. The wafers W have undergone a wiring embedding process using dry etching or chemical vapor deposition (CVD). Therefore, an electric wiring structure is formed inside the wafers W. Subsequently, the gate valve G is closed. The inside of the vacuum chamber 1 is completely evacuated by a vacuum pump 86, and simultaneously the turntable is rotated at, for example, 120 rpm in the clockwise direction. Further, the lamp unit 7 is operated.

Into the heating area H (see FIG. 12) below the lamp unit 7, infrared light having a wavelength of 0.5 µm or longer to 3 µm or shorter is emitted from the heat lamps 71. Therefore, light energy generated by the heat lamp 71 is transmitted through the window 61 of the transmissive member 6 and is absorbed by the wafers W passing through the heating area H. The wafers W are heated by radiation heat. Further, as described above, because the light with light energy efficiently irradiates the wafers W, the wafers W are heated at every passage of the wafers W through the heating area H by the rotation of the turntable 2. Thus, the surface temperatures of the wafers W increase. Therefore, the wafers W are indirectly heated by the heater unit 5 through the turntable 2 and directly heated by the lamp unit 7 thereby having a processing temperature equal to or higher than a temperature, at which an ozone gas is thermally decomposed.

After the surfaces of the wafers W are heated to have the processing temperature, a 3DMAS gas is discharged at a predetermined flow rate, and oxygen plasma is supplied at a predetermined flow rate from the activating gas injector 32. Further, a separation gas is discharged from the separation gas nozzles 41 and 42, and a $N_2$ gas is discharged from a separation gas supplying tube 40 and purge gas supplying pipes 15 and 53. The inside of the vacuum chamber 1 is adjusted by a pressure controller 85 to have a predetermined process pressure, for example, 400 Pa to 500 Pa.

Figure 13:
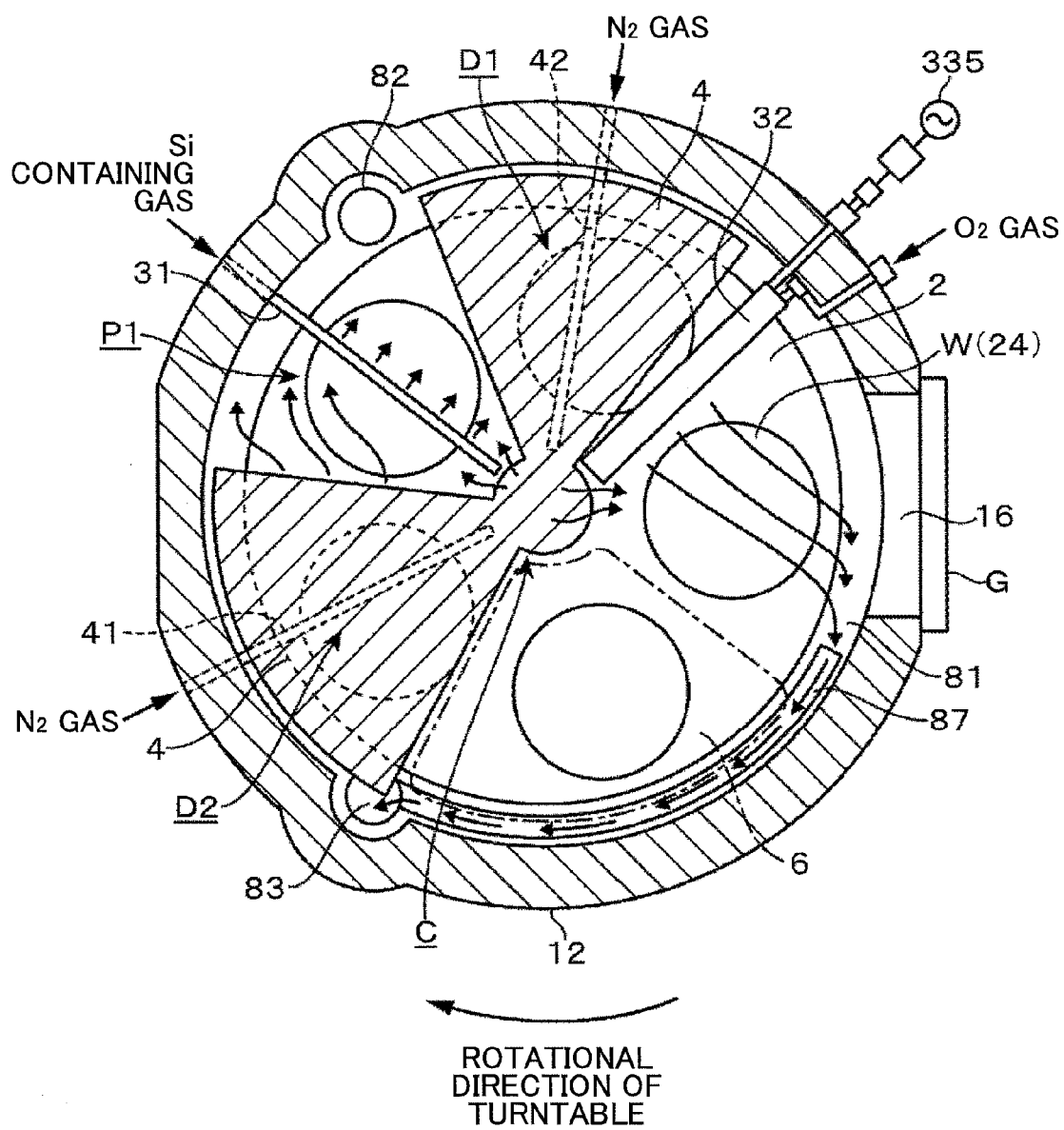
FIG. 13 schematically illustrates a flow of gas in the film forming apparatus.

The conditions of the gas flow are illustrated in FIG. 13. Because the $N_2$ gases are supplied to the separating areas D1 and D2 between the first and second process areas P1 and P2 and the first and second evacuation ports 82 and 83 are formed as described above, the 3DMAS gas and the oxygen plasma flow without being mixed each other and are evacuated. Further, because the purge gas is supplied below the turntable 2, the gas dispersing toward a lower side of the turntable 2 is pushed back toward the first and second evacuation ports 82 and 83 by the purge gas. Further, because the labyrinth structure 18 is provided in the center area C, the processing gases are prevented from being mixed in the center area C as described above.

Furthermore, the oxygen plasma and the $N_2$ gas flow toward the transmissive member 6 along the rotation of the turntable 2 from the upstream side (in the rotational direction) of the transmissive member 6 in the turntable 2. However, since the gas flow route 87 is formed in the side ring 87 on the outer peripheral side of the transmissive member 6, the oxygen plasma and the $N_2$ gas flow by bypassing the transmissive member 6 and passes through the gas flow route 87 so as to be evacuated through the gas flow route 87.

On the other hand, a part of the gases flowing toward the transmissive member 6 from the upstream side of the transmissive member 6 and the center area C tends to intrude below the transmissive member 6. However, the curtain portion 64 (FIG. 7) is formed in the transmissive member 6 to cover the lower area of the transmissive member 6. Therefore, the gas smashes against the curtain portion 64. Then, the flow path of the gas is changed and the gas flows toward the side ring 81. Thus, the oxygen plasma and the $N_2$ gas are prevented from flowing into the lower side of the transmissive member 6.

As described, the 3DMAS gas is supplied into the first process area P1, and the oxygen plasma is supplied into the second process area P2. Therefore, when the wafers W reach the first process area by the rotation of the turntable 2, the 3DMAS gas whose molecular layer includes one layer or a plurality of layers is absorbed on the surfaces of the wafers W in the process area P1. Said differently, at the processing temperature equal to or higher than the temperature, at which the ozone gas is thermally decomposed, the 3DMAS gas is absorbed on the wafers W and the absorbed 3DMAS gas is oxidized by the oxygen plasma thereby forming a silicon dioxide ($SiO_2$) film being a component of a thin film.

As described, the 3DMAS gas absorbed on the wafers W is oxidized by the oxygen plasma at the high processing temperature, the activity of the oxygen plasma is enhanced to quickly combine silicon with oxygen. Impurities such as hydrogen or organic matter are removed by aerification. Therefore, the number of Si—O bonds becomes great and the number of Si—OH bonds is reduced. Thus, bonds among atoms become firm and are densified. Resultantly, a film having high denseness can be formed. Accordingly, a thin film having a film quality corresponding to an application portion of the $SiO_2$ film can be obtained upon request by a user.

Within the first embodiment, in consideration of heat resistance of the apparatus body, the temperature of the turntable 2 heated by the heater unit 5 is set to the temperature lower than the temperature, at which the ozone gas is thermally decomposed. Additionally, the wafers W are heated by the radiation heat from the lamp unit 7. Said differently, the heatproof temperature of the sealing mechanism of the driving mechanism 23 of the turntable 2 and the heatproof temperature of the O-ring between the ceiling plate 11 and the chamber body 12 are not high enough. Therefore, the maximum temperature of the turntable 2 allowable for the performance of the film deposition apparatus is set to a temperature lower than the temperature, at which the ozone gas is thermally decomposed. On the other hand, because the wafers W are directly heated by the radiation heat generated from the lamp unit 7, the temperature increment of the turntable 2 can be prevented. Thus, only the wafers W can be heated to have the processing temperature higher than the temperature, at which the ozone gas is thermally decomposed. Even if the wafers W are heated to have such a high processing temperature, the temperature of the turntable 2 is set to a temperature lower than the temperature, at which the ozone gas is thermally decomposed. Therefore, the heat resistance of the film deposition apparatus is not adversely affected, and it is unnecessary to make the sealing mechanism or the like of the turntable 2 have great heat resistance. Further, the second process gas includes active species of oxygen, which are thermally decomposed at a temperature higher than the temperature, at which the ozone gas is thermally decomposed.

Therefore, while the specifications of the heat resistance of the film deposition apparatus are determined for a case where the ozone gas is used as an oxidation gas, only the wafers W can be heated at the processing temperature equal to or higher than the temperature, at which the ozone gas is thermally decomposed. Thus, the film deposition process of the silicon dioxide film can be performed at a high temperature equal to or higher than the thermally decomposed temperature of the silicon dioxide film.

As such, if the film deposition process for the silicon dioxide film is performed, a hard film whose denseness is enhanced is obtainable. For example, a film deposition process conforming to a user's request such as a request for a hard film in order to improve wet-etching characteristics can be performed.

Accordingly, if a manufacturer's side of a film deposition apparatus prepares the film deposition apparatus having specifications of using the ozone gas as an oxidation gas in designing the heat resistance, for a user using the ozone gas, it is unnecessary to mount the auxiliary heating mechanism on the film deposition apparatus, and for a user who wishes to obtain a film at a temperature equal to or higher than the temperature at which the ozone gas is thermally decomposed, the auxiliary heating mechanism is prepared to be mounted on the film deposition apparatus. Therefore, without manufacturing a film deposition apparatus having special specifications different from a film deposition apparatus designed to use the ozone gas, the structure can be common to the film deposition apparatuses having different specifications. Thus, manufacturing efficiency becomes good and the manufacturing cost for the film deposition apparatuses can be prevented from increasing.

Further, in the above first embodiment, the lamp unit 7 is provided on the downstream side of the activating gas injector 32 in the rotational direction of the turntable 2 and on the upstream side of the second separating area D2 in the rotational direction of the turntable 2. Therefore, the lamp unit 7 is apart from the area where the oxygen plasma is supplied by the activating gas injector 32. Then, when the wafers W pass on the lower side of the transmissive member 6, the 3DMAS gas and the oxygen plasma, which are not absorbed by the wafer W, may scarcely be brought into the heating area H. Therefore, adhesion of the reaction product produced by the 3DMAS gas and the oxygen plasma to the transmissive member 6 scarcely occurs, and the transmission factor of the window 61 can be maintained to be constant. Therefore, a temperature variation among the wafers for each lot scarcely occurs. Thus, a stable film deposition process can be performed. Further, a cleaning process of removing the reaction product adhered to the window 61 may become unnecessary or the frequency of cleaning the window 61 may become low.

Further, because a plurality of heat lamps 71 irradiating infrared light are used, it is possible to control the size of the heating area, a temperature distribution at a time of heating, or the like depending on the arrangement of the heat lamps 71 and the electric power supply amount. In the above example, a peripheral velocity on an outer edge side is faster than a peripheral velocity on a center side when the turntable 2 rotates. However, the number of the heat lamps 71 is greater on the outer edge side than on the center side. Therefore, degrees of heating are maintained to be substantially equal in the radius directions of the turntable 2.

Furthermore, within the first embodiment, the transmissive member 6 is provided in the ceiling plate 11. The lamp unit 7 is provided on the upper side of the ceiling plate 11 so as to face the turntable 2 through the transmissive member 6. Thus, because the lamp unit 7 is located in the ambient atmosphere, maintenance becomes easy and the reaction product can be prevented from attaching to the lamp unit 7.

Further, the transmissive member 6 is formed as the circular concave portion which is recessed onto the side of the turntable 2 from the ceiling plate 11. Therefore, the lamp unit 7 can approach the wafers W on the turntable 2, and can efficiently heat the surfaces of the wafers W. Further, by forming the transmissive member 6 as the circular concave portion, the volume of the vacuum chamber 1 can be reduced.

Further, a locus area where the wafers W pass can be evenly heated by arranging the heat lamps 71 of the lamp unit 7 so as to spread in a fan-like form from the rotation center of the turntable 2 toward the outer edge.

Second Embodiment

Figure 14:
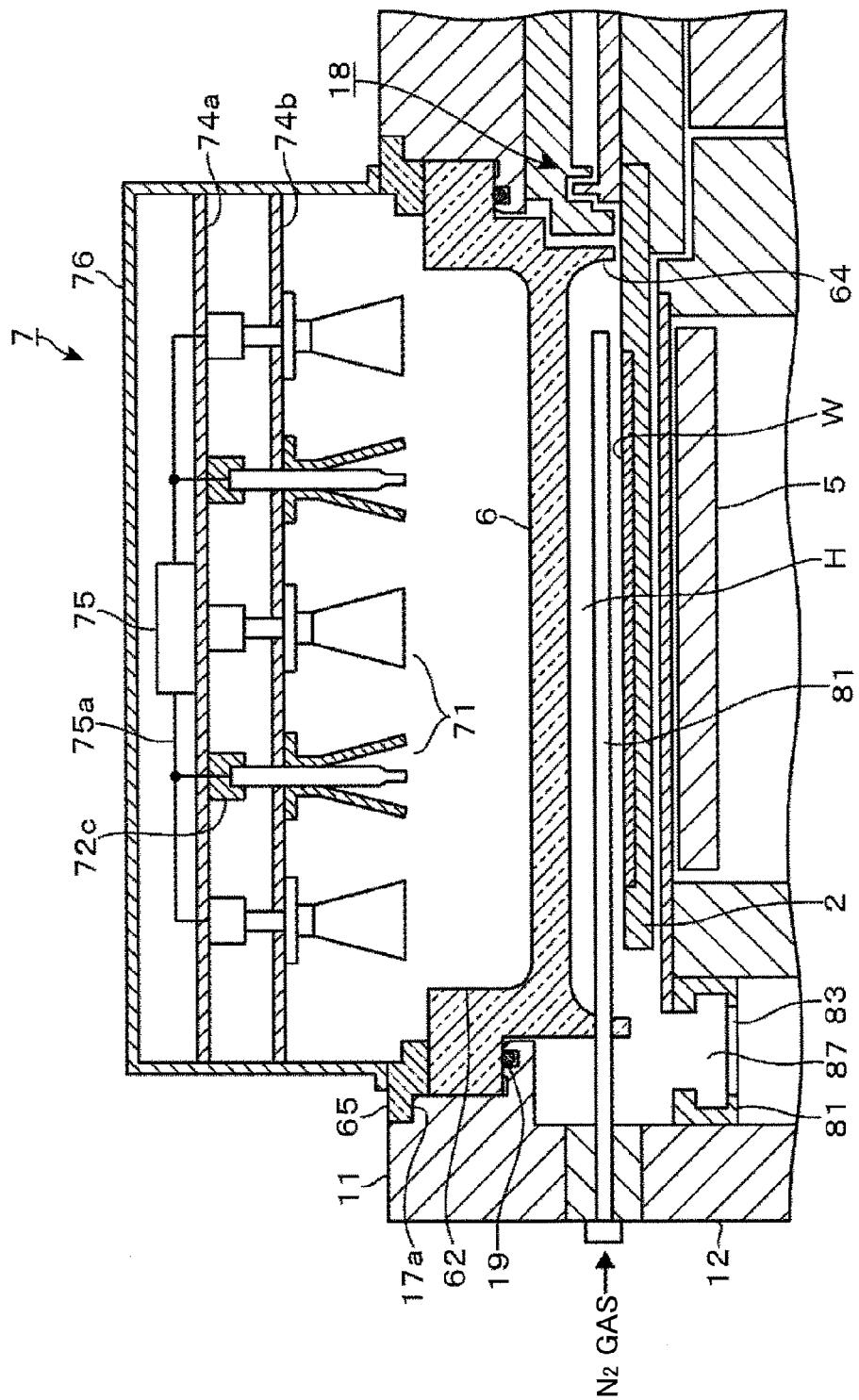
FIG. 14 is a vertical cross-sectional view illustrating a film forming apparatus of second embodiment.

Next, the second embodiment of the present invention is described. Within the second embodiment, as illustrated in FIG. 14, a purge gas supplying pipe 81 for supplying a purge gas is provided on the lower side of the transmissive member 6. The purge gas supplying pipe 81 is provided in, for example, an area surrounded by the inner peripheral surface of the curtain portion 64, the lower surface of the transmissive member 6, and the upper surface of the turntable 2. The purge gas supplying pipe 81 faces the wafers W and horizontally extends from the outer peripheral wall to the center area C. Further, the purge gas supplying pipe 81 is connected with a supply source of a purge gas, for example, a nitrogen gas through a supply route including a flow rate adjusting valve (not illustrated). The purge gas supplying pipe 81 has gas discharging ports formed on the lower surface of the purge gas supplying pipe 81. The purge gas is discharged into the lower area of the transmissive member 6 through the gas discharging ports.

With this structure, the film deposition process is performed while discharging the purge gas on the lower side of the transmissive member 6. The purge gas smashes against the lower side of the curtain portion 64 and drives the oxygen plasma and the $N_2$ gas, which are forced to flow from the upstream side into the lower side of the transmissive member 6, out of the transmissive member 6. Therefore, the oxygen plasma or the like can be prevented from intruding onto the lower side of the transmissive member 6. Thus, it is possible to securely prevent the film formation of the reaction product on the window 61.

Figure 15:
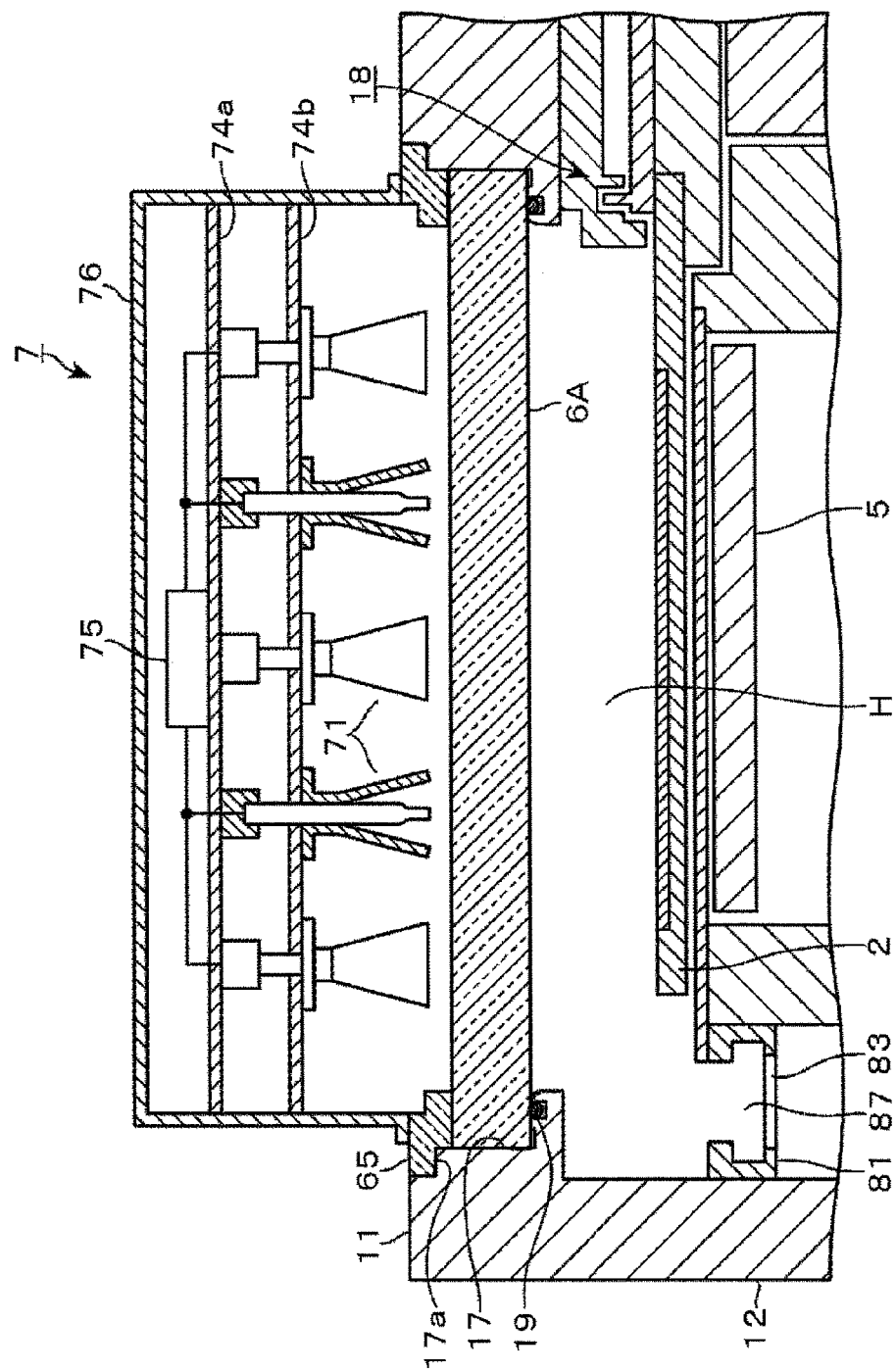
FIG. 15 is a vertical cross-sectional view illustrating another exemplary film forming apparatus of second embodiment.

Further, it is unnecessary to form a transmissive member 6A in a shape of a circular concave portion recessing from the ceiling plate 11 toward the lower side of the transmissive member 6A. Referring to FIG. 15, the transmissive member 6A may be formed in a plate-like shape and is fit to the opening portion 17 formed in the ceiling plate 11 through the sealing member 19. Referring to FIG. 15, it is not always necessary to provide the curtain portion in a peripheral edge portion of the transmissive member on the back surface of the transmissive member 6A. In a case where the lamp unit 7 is located sufficiently apart from the activating gas injector in the rotational direction of the turntable 2 as illustrated in FIG. 3, the oxygen plasma hardly intrudes onto the lower side of the transmissive member 6A. Therefore, the reaction products including the 3DMA gas and the oxygen plasma scarcely attach to the transmissive member 6A.

Figure 16:
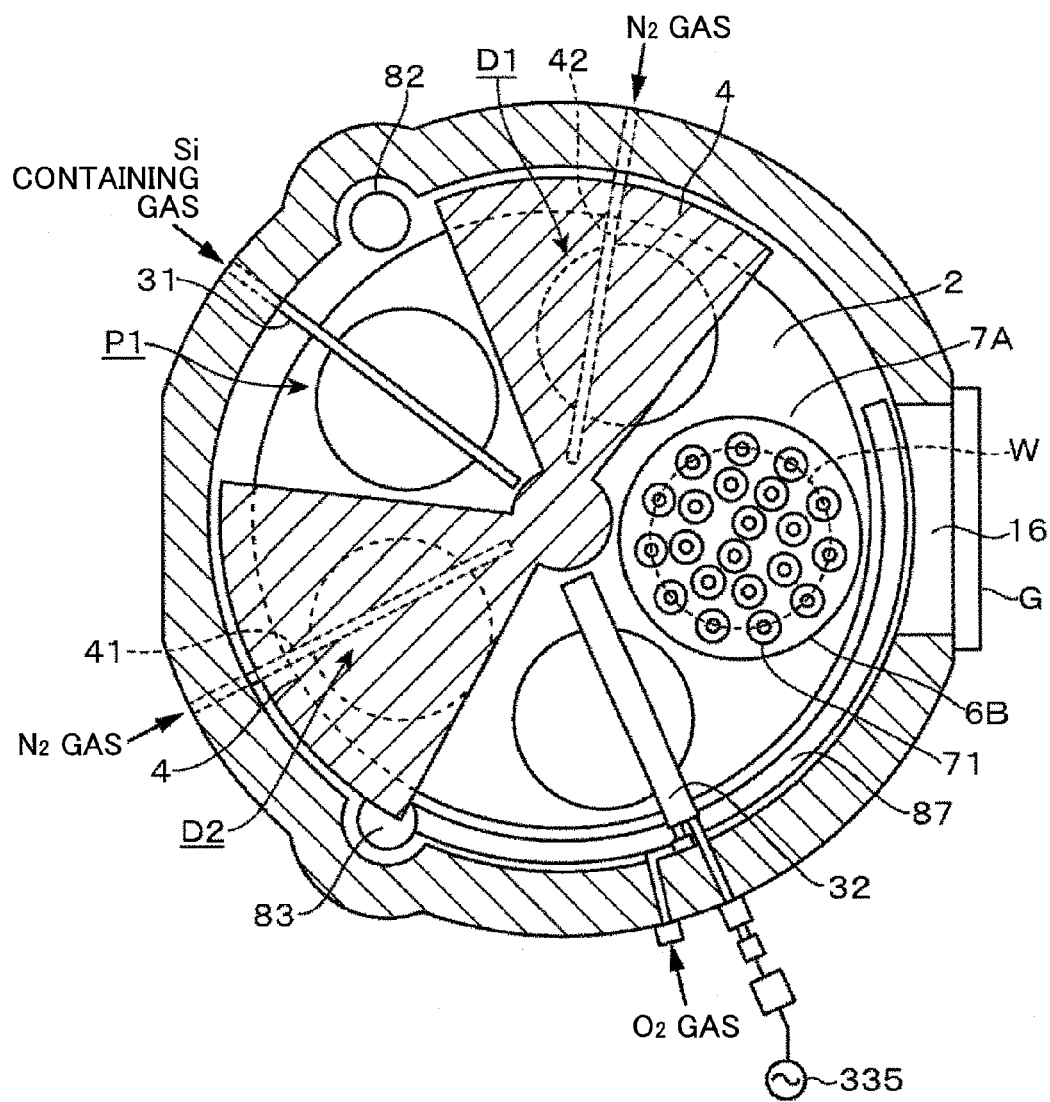
FIG. 16 is a horizontal cross-sectional plan view of the film deposition apparatus.

Furthermore, within the second embodiment, the lamp unit may be provided in any position as long as the lamp unit 7 does not interfere with the separating areas D1 and D2. For example, referring to FIG. 16, a lamp unit 7A is located on the downstream side of the process gas nozzle 31 in the rotational direction of the turntable 2, and on the upstream side of the activating gas injector 32 in the rotational direction of the turntable 2 relative to the process gas nozzle 31. Further, a transmissive member 6B is not limited to have a fan-like shape in its plan view. For example, as illustrated in FIG. 16, the transmissive member 6B may be shaped like a circle in its plan view having a size covering the surfaces of the wafers W. Furthermore, the arrangement of the heat lamps 71 of the lamp unit 7A is properly set in conformity with the shape of the transmissive member 6B.

In the above structure, the heater unit may be embedded in the turntable 2. As described above, the wafers W are heated at every passage of the wafers W through the lower side of the lamp unit 7. It is sufficient for the wafers W of being heated to finally have the processing temperature. Therefore, the lamp unit 7 is not necessarily structured to emit light energy on the entire surfaces of the wafers W. The lamp unit 7 may be structured to emit the light energy only parts of the surfaces of the wafers W.

Further, a plurality of lamp units may be provided so that the plurality of lamp units are arranged apart from each other in the rotational direction of the turntable 2. Furthermore, the material of the transmissive member 6 may be heat-resistant glass instead of quartz.

Further, a gas supply portion for supplying the ozone gas to the above firm deposition apparatus may be provided. In a case where only one film deposition apparatus is used to perform the process using the ozone gas, the film deposition process is performed without using the auxiliary heating mechanism, and the auxiliary heating mechanism is used for the film deposition process at the processing temperature equal to or higher than the temperature at which the ozone gas is thermally decomposed. Thus, a plurality of types of the film deposition processes for depositing the silicon dioxide film can be performed by only one film deposition apparatus. The user can enjoy a high degree of freedom in selecting the processes.

The first process gas used in the second embodiment is a BTBAS gas, dichlorosilane (DCS), hexachlorodisilane (HCD), monoaminosilane, or the like. In a case where the surface of the turntable 2 is heated to have a temperature of 630° C. or higher, it is preferable to use a 3DMAS gas or a tetrakisdimethylaminosilane $(Si(N(CH_3)_2))_4)$ (4DMAS) gas. The number of the reaction gases is not limited to two. Three or greater types of the reaction gases may be sequentially supplied on the substrates in the film deposition apparatus. In this case, for example, a 3DMAS gas as the first process gas (a Si containing gas), oxygen plasma as the second process gas, an Ar plasma gas as a third process gas are used to heat the wafers W using the heater unit 5 and the lamp unit 7 to have the processing temperature equal to or higher than the temperature, at which the ozone gas is thermally decomposed to thereby deposit the silicon dioxide film.

In the above example, the heat lamp 7 irradiates infrared rays in a wavelength range where the infrared rays are absorbed by a silicon wafer being the substrate and are transmitted through quartz, which is a material of the turntable 2. Within the second embodiment, the heat lamps 71 are not limited to the above described heat lamps as long as the radiated light has a wavelength in which a degree of absorption to the substrate is higher than to the turntable 2, said differently, as long as the heat lamps 71 irradiate light having a wavelength region in which transmittance to the turntable 2 is higher than transmittance to the substrate.

Third Embodiment

Figure 17:
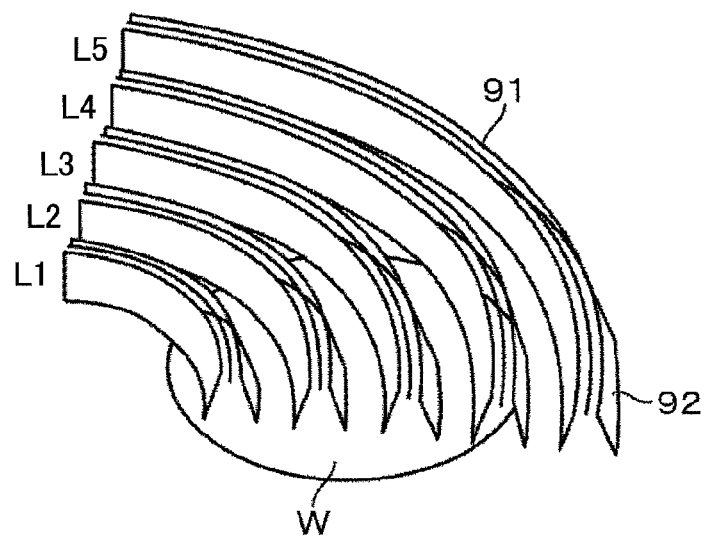
FIG. 17 is a perspective view of an analysis model used for simulating heating by a lamp unit.

Subsequently, a result of simulating temperature distribution on the surfaces of the wafers W when the wafers W are heated by the above described lamp unit 7 is described. Referring to FIG. 17, the simulation has been performed using an analytic model where lamp bodies 91 are arranged along arcs which are parts of concentric circles L1 to L5 and reflectors 92 are respectively provided on the center side and the outer side of each of the concentric circles L1 to L5. At this time, the wafers W are heated to have a temperature of 600° C., and an electric power supply to the lamp bodies 91 along the concentric circles L1 to L5 is changed.

Figure 18:
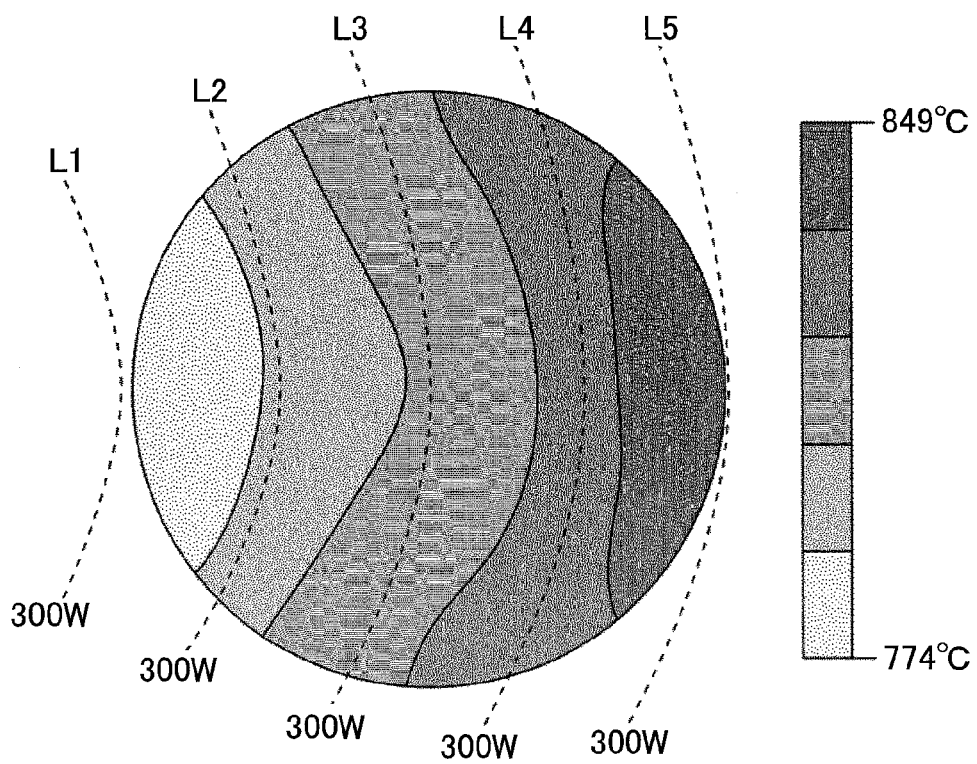
FIG. 18 is a characteristic diagram illustrating a result of simulating heating with a lamp unit.
Figure 19:
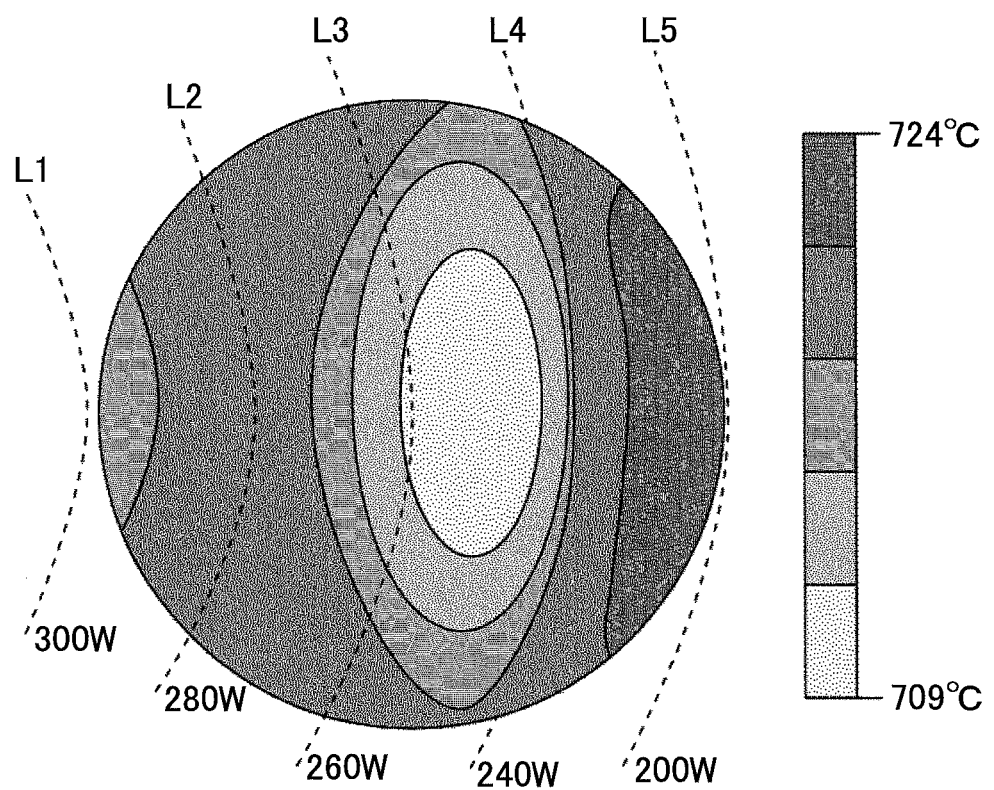
FIG. 19 is a characteristic diagram illustrating a result of simulating heating with the lamp unit.
Figure 20:
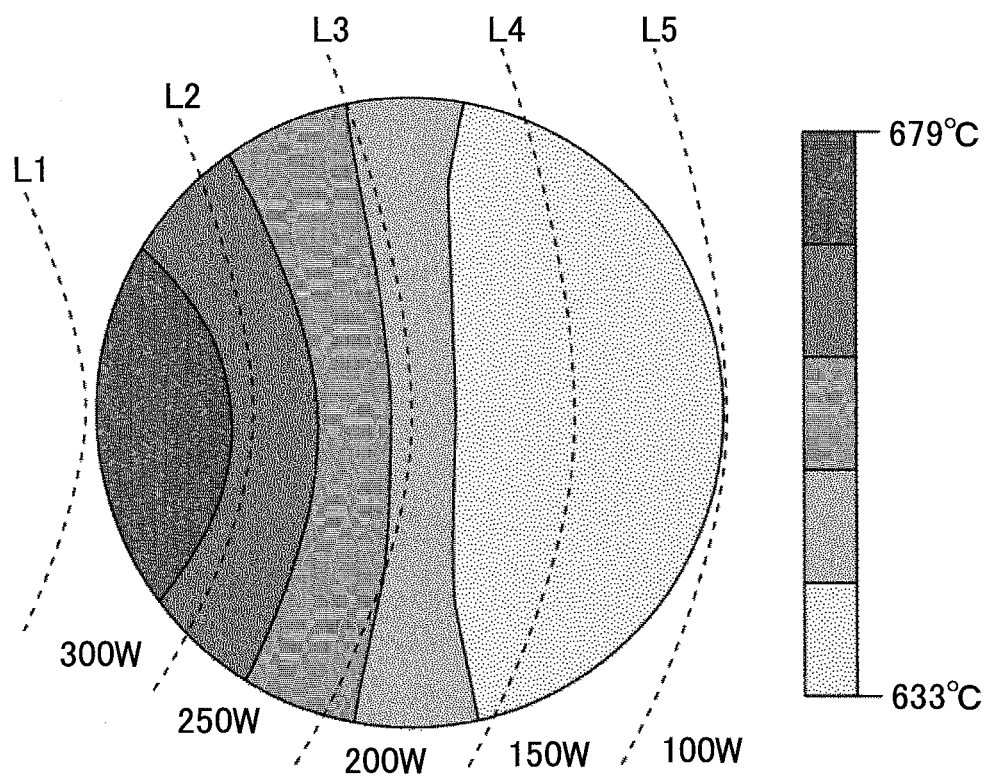
FIG. 20 is a characteristic diagram illustrating a result of simulating heating with the lamp unit.

FIG. 18 illustrates an analysis result in a case where the electric power supply to the lamp bodies 91 along the concentric circles L1 to L5 is 300 W. Further, FIG. 19 illustrates an analysis result in a case where the electric power supply to the lamp bodies 91 along the concentric circle L1 is 300 W, the electric power supply to the lamp bodies 91 along the concentric circle L2 is 280 W, the electric power supply to the lamp bodies 91 along the concentric circle L3 is 260 W, the electric power supply to the lamp bodies 91 along the concentric circle L4 is 240 W, and the electric power supply to the lamp bodies 91 along the concentric circle L5 is 200 W. Further, FIG. 20 illustrates an analysis result in a case where the electric power supply to the lamp bodies 91 along the concentric circle L1 is 300 W, the electric power supply to the lamp bodies 91 along the concentric circle L2 is 250 W, the electric power supply to the lamp bodies 91 along the concentric circle L3 is 200 W, the electric power supply to the lamp bodies 91 along the concentric circle L4 is 150 W, and the electric power supply to the lamp bodies 91 along the concentric circle L5 is 100 W.

With these simulation analyses, referring to FIG. 18, the temperature distribution is displayed by separating into five temperatures where the maximum temperature is 849° C. and the minimum temperature is 774° C. In a manner similar to the above, referring to FIG. 19, the temperature distribution is displayed by separating into five temperatures where the maximum temperature is 724° C. and the minimum temperature is 709° C. In a manner similar to the above, referring to FIG. 20, the temperature distribution is displayed by separating into five temperatures where the maximum temperature is 679° C. and the minimum temperature is 633° C. From these analysis results illustrated in FIGS. 18 to 20, it was known that the surfaces of the wafers W can be heated to have the temperature equal to or greater than 700° C. by heating the wafers W with the lamp unit 5 so as to have the temperature of 600° C. Further, when the electric power supply to the heat lamps 71 arranged along the concentric circles L1 to L5 is changed, the temperature distribution on the surface on the wafers becomes great. By properly adjusting the electric power supply to the each of the heat lamps 71 and by properly arranging the heat lamp 13, a desired temperature distribution is obtainable.

Within the embodiments, when the silicone dioxide film is deposited by the so-called ALD method of rotating the substrates on the turntable, the permissible maximum temperature of the turntable is set to be lower than the temperature at which the ozone gas is thermally decomposed. On the other hand, the substrates is heated to have the temperature at which the ozone gas is thermally decomposed by directly heating the auxiliary heating mechanism in addition to indirect heating of heating the substrates through the turntable by the main heating mechanism. Simultaneously, the active species of oxygen are used as the oxidation gas instead of the ozone gas. Therefore, without giving great heat resistance to the sealing mechanism or the like of the turntable, the film deposition process can be performed at a high temperature equal to or higher than the thermally decomposed temperature for the ozone gas. Accordingly, if the manufacturer's side of the film deposition apparatus prepares the film deposition apparatus having specifications of using the ozone gas as the oxidation gas in designing the heat resistance, for the user using the ozone gas, it is unnecessary to mount the auxiliary heating mechanism on the film deposition apparatus, and for the user who wishes to obtain a film at a temperature equal to or higher than the temperature at which the ozone gas is thermally decomposed, the auxiliary heating mechanism is prepared to be mounted on the film deposition apparatus. Because the structure is common to the film deposition apparatuses having different specifications, manufacturing efficiency becomes good and the manufacturing cost for the film deposition apparatuses can be prevented from increasing.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the claims have been described in detail, it should be understood that the various changes, substitutions, and alterations could be made hereto without departing from the spirit and scope of the invention.

What is claimed is:

1. A film deposition apparatus for forming a thin film by laminating layers of reaction product after repeating a plurality of cycles of sequentially supplying mutually different process gases to a substrate mounted on a turntable inside a vacuum chamber while orbitally revolving the substrate mounted on the turntable, the film deposition apparatus comprising:
    a first process gas supplying portion that supplies a first process gas containing silicon to the substrate to cause the substrate to absorb the first process gas;
    a second process gas supplying portion that is located apart in a rotational direction of the turntable from the first process gas supplying portion, the second process gas supplying portion supplying a second process gas containing active species obtained by activating oxygen to the substrate to oxidize the first process gas absorbed by the substrate in order to produce a silicone dioxide;
    a separating area that is located between the first gas supplying portion and the second gas supplying portion, the separating area preventing the first process gas and the second process gas from mixing;
    a main heating mechanism that heats the turntable to heat the substrate through the turntable from a lower side of the substrate; and
    an auxiliary heating mechanism that includes a heat lamp located above the turntable so as to face an area where the substrate on the turntable passes, the heat lamp irradiating light having an absorption wavelength range absorbable by the substrate to directly heat the substrate so that the substrate has a processing temperature equal to or higher than a temperature at which an ozone gas is thermally decomposed by radiation heat generated by the irradiated light,
    wherein a maximum temperature of the turntable allowed for performing functions of the film deposition apparatus is lower than the temperature at which the ozone gas is thermally decomposed, and
    at the processing temperature, the first process gas is absorbed by the substrate and the absorbed first process gas is oxidized by the second process gas.
2. The film deposition apparatus according to claim 1, wherein the wavelength range of the light irradiated in the auxiliary heating mechanism is determined so that a degree of absorption for the turntable is smaller than a degree of absorption for a material of the substrate.

3. The film deposition apparatus according to claim 1, wherein the wavelength range of the light irradiated in the auxiliary heating mechanism is determined so that the light can be transmitted through a material of the turntable.

4. The film deposition apparatus according to claim 1, wherein the substrate is a silicon wafer,
a material of the turntable is quartz,
the wavelength of the light is determined such that the light irradiated in the auxiliary heating mechanism is absorbed by silicon and transmitted through quartz.

5. The film deposition apparatus according to claim 4, wherein the wavelength of the light irradiated in the auxiliary heating mechanism is equal to or higher than 0.5 μm and equal to or lower than 3 μm.

6. A method of depositing a silicon dioxide film by laminating layers of reaction product after repeating a plurality of cycles of sequentially supplying mutually different process gases to a substrate, the method of depositing a silicon dioxide film using a film deposition apparatus including
a turntable located inside a vacuum chamber,
a first process gas supplying portion that supplies a first process gas containing silicon to the substrate mounted on a surface of the turntable to cause the substrate to absorb the first process gas,
a second process gas supplying portion that is located apart in a rotational direction of the turntable from the first process gas supplying portion, the second process gas supplying portion supplying a second process gas containing active species obtained by activating oxygen to the substrate to oxidize the first process gas absorbed by the substrate in order to produce a silicone dioxide, and
a separating area that is located between the first gas supplying portion and the second gas supplying portion, the separating area preventing the first process gas and the second process gas from mixing,
wherein a maximum temperature of the turntable allowed for performing functions of the film deposition apparatus is lower than the temperature at which an ozone gas is thermally decomposed, the method of depositing the silicon dioxide film comprising:
orbitally revolving the substrate mounted on the turntable by rotating the turntable;
heating the turntable by a main heating mechanism to heat the substrate through the turntable from a lower side of the substrate;
directly heating the substrate so that the substrate has a processing temperature equal to or higher than a temperature at which an ozone gas is thermally decomposed by radiation heat generated by light having an absorption wavelength range absorbable by the substrate, the light being irradiated by an auxiliary heating mechanism that includes a heat lamp located above the turntable so as to face an area where the substrate on the turntable passes;
causing the substrate to absorb the first process gas at the processing temperature; and
oxidizing the first process gas absorbed by the substrate using the second process gas.

7. The method of depositing the silicon dioxide film according to claim 6, wherein the wavelength range of the light irradiated in the auxiliary heating mechanism is determined so that a degree of absorption for the turntable is smaller than a degree of absorption for a material of the substrate.

* * * * *